(12) United States Patent
Hsu et al.

(10) Patent No.: US 9,077,151 B2
(45) Date of Patent: Jul. 7, 2015

(54) SEMI-POLAR III-NITRIDE OPTOELECTRONIC DEVICES ON M-PLANE SUBSTRATES WITH MISCUTS LESS THAN +/-15 DEGREES IN THE C-DIRECTION

(75) Inventors: Po Shan Hsu, Arcadia, CA (US);
Kathryn M. Kelchner, Santa Barbara, CA (US); Robert M. Farrell, Goleta, CA (US); Daniel A. Haeger, Goleta, CA (US); Hiroaki Ohta, Tokyo (JP); Anurag Tyagi, Goleta, CA (US); Shuji Nakamura, Santa Barbara, CA (US); Steven P. DenBaars, Goleta, CA (US); S. James Speck, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 476 days.

(21) Appl. No.: 13/041,120

(22) Filed: Mar. 4, 2011

(65) Prior Publication Data

US 2011/0216795 A1 Sep. 8, 2011

Related U.S. Application Data

(60) Provisional application No. 61/310,638, filed on Mar. 4, 2010.

(51) Int. Cl.
*H01S 5/00* (2006.01)
*H01S 5/32* (2006.01)
(Continued)

(52) U.S. Cl.
CPC .............. *H01S 5/3202* (2013.01); *B82Y 20/00* (2013.01); *H01L 21/02389* (2013.01); *H01L 21/02433* (2013.01); *H01L 21/0254* (2013.01); *H01L 21/02609* (2013.01); *H01S 5/0014* (2013.01);
(Continued)

(58) Field of Classification Search
USPC .................. 372/43.01, 44.011, 50.1, 45.012, 372/45.011; 117/89, 90, 93, 94, 105, 106, 117/84, 88, 101, 902, 937, 952; 438/492, 438/500, 503, 507, 26–29, 39, 42, 46, 17; 257/E21.108, E21.112, 257/E21.125–E21.127, 96–98.13, E33.019, 257/E33.021, E33.027–E33.029, E33.033, 257/E33.04, E33.039, E33.042
See application file for complete search history.

(56) References Cited

U.S. PATENT DOCUMENTS 6,849,472 B2 2/2005 Krames et al.
8,158,497 B2 4/2012 Hirai et al.
(Continued)

FOREIGN PATENT DOCUMENTS

CN 101165979 4/2008
CN 101465518 6/2009
(Continued)

OTHER PUBLICATIONS

Hisashi Yamada et al. "Impact of Substrate Miscut on the Characteristic of m-plane InGaN/GaN Light Emitting Diodes", Japanese Journal of Applied Physics; vol. 46, No. 46, 2007, pp. L1117-L1119.*
(Continued)

*Primary Examiner* — Tod T Van Roy
*Assistant Examiner* — Delma R Forde
(74) *Attorney, Agent, or Firm* — Gates & Cooper LLP

(57) ABSTRACT

An optoelectronic device grown on a miscut of GaN, wherein the miscut comprises a semi-polar GaN crystal plane (of the GaN) miscut x degrees from an m-plane of the GaN and in a c-direction of the GaN, where $-15 < x < -1$ and $1 < x < 15$ degrees.

28 Claims, 14 Drawing Sheets

(51) Int. Cl.
| | |
|---|---|
| *B82Y 20/00* | (2011.01) |
| *H01L 21/02* | (2006.01) |
| *H01S 5/343* | (2006.01) |
| *H01S 5/20* | (2006.01) |
| *H01S 5/22* | (2006.01) |
| *H01S 5/30* | (2006.01) |
| *H01S 5/34* | (2006.01) |

(52) U.S. Cl.
CPC ............ *H01S 5/2009* (2013.01); *H01S 5/22* (2013.01); *H01S 5/3063* (2013.01); *H01S 5/3404* (2013.01); *H01S 5/34333* (2013.01); *H01S 2304/04* (2013.01)

(56) References Cited

U.S. PATENT DOCUMENTS

| | | | |
|---|---|---|---|
| 8,247,887 B1* | 8/2012 | Raring et al. | 257/628 |
| 8,278,128 B2* | 10/2012 | Masui et al. | 438/46 |
| 8,284,810 B1* | 10/2012 | Sharma et al. | 372/44.011 |
| 2003/0085409 A1 | 5/2003 | Shen et al. | |
| 2003/0089917 A1 | 5/2003 | Krames et al. | |
| 2007/0218703 A1* | 9/2007 | Kaeding et al. | 438/775 |
| 2008/0095492 A1 | 4/2008 | Son et al. | |
| 2008/0187016 A1 | 8/2008 | Schowalter et al. | |
| 2009/0145476 A1 | 6/2009 | Fetzer et al. | |
| 2009/0146170 A1* | 6/2009 | Zhong et al. | 257/98 |
| 2009/0162962 A1 | 6/2009 | Suzuki et al. | |
| 2009/0194761 A1 | 8/2009 | Masui et al. | |
| 2009/0236694 A1 | 9/2009 | Mizuhara et al. | |
| 2009/0250686 A1 | 10/2009 | Sato et al. | |
| 2009/0309105 A1 | 12/2009 | Letts et al. | |
| 2010/0008393 A1 | 1/2010 | Enya et al. | |
| 2010/0219416 A1* | 9/2010 | Farrell et al. | 257/76 |
| 2010/0276663 A1 | 11/2010 | Enya et al. | |
| 2010/0309943 A1* | 12/2010 | Chakraborty et al. | 372/45.012 |
| 2010/0316075 A1* | 12/2010 | Raring et al. | 372/44.011 |
| 2011/0064102 A1* | 3/2011 | Raring et al. | 372/44.011 |
| 2011/0237054 A1 | 9/2011 | Iso et al. | |
| 2012/0086106 A1* | 4/2012 | Hirai et al. | 257/615 |
| 2012/0175739 A1 | 7/2012 | Hirai et al. | |
| 2012/0273796 A1* | 11/2012 | Zhao et al. | 257/76 |
| 2013/0016750 A1* | 1/2013 | Raring et al. | 372/45.01 |

FOREIGN PATENT DOCUMENTS

| | | |
|---|---|---|
| CN | 101626058 | 1/2010 |
| CN | 101652832 | 2/2010 |
| WO | 2008094464 | 8/2008 |
| WO | 2010016459 | 2/2010 |

OTHER PUBLICATIONS

Asamizu, H. et al., "Demonstration of 426 nm InGaN/GaN laser diodes fabricated on free-standing semipolar (1122) gallium nitride substrates," Applied Physics Express 1 (2008) 091102.
Avramescu, A. et al., "InGaN laser diodes with 50 mW output power emitting at 515 nm," Applied Physics Letters 95, 071103 (2009).
Bruninghoff, S. et al., "Temperature dependence of blue InGaN lasers," Proc. of SPIE, vol. 7216 (2009) 72161C.
Enya, Y. et al., "531 nm green lasing of InGaN based laser diodes on semi-polar {2021}free-standing GaN substrates," Applied Physics Express 2 (2009) 082101.
Feezel, D. et al., "AlGaN-cladding-free nonpolar InGaN/GaN laser diodes," Jpn. J. Appl. Phys. 46 (2007) L284.
Fischer, A. et al., "Misfit strain relaxation by stacking fault generation in InGaN quantum wells grown on m-plane GaN," Applied Physics Express 2 (2009) 041002.
Funato, M. et al., "Weak carrier/exciton localization in InGaN quantum wells for green laser diodes fabricated on semi-polar {2021}GaN substrates," Applied Physics Express 3 (2010) 021002.
Hsu, P. et al., "InGaN/GaN laser diodes grown on (3031) and (3031) free-standing GaN substrates," Powerpoint slides, Solid State Lighting and Energy Center Annual Review, University of California, Santa Barbara, Nov. 5, 2010.
Kelchner, K. et al., "Nonpolar AlGaN-cladding-free blue laser diodes with InGaN waveguiding," Applied Physics Express 2 (2009) 071003.
Kozaki, T. et al., "High-power and wide wavelength range GaN-based laser diodes," Proc. of SPIE, vol. 6133, 613306 (2006).
Kubota, M. et al., "Continuous-wave operation of blue laser diodes based on nonpolar m-plane gallium nitride," Applied Physics Express 1 (2008) 011102.
Lin, Y. et al., "Blue-green InGaN/GaN laser diodes on miscut m-plane GaN substrates," Applied Physics Express 2 (2009) 082102.
Matthews,J. et al., "Defects in epitaxial multilayers," Journal of Crystal Growth 27 (1974) 118-125.
Miyoshi, T. et al., "510-515 nm In GaN-based green laser diodes on c-plane GaN substrate," Applied Physics Express 2 (2009) 062201.
Muller, J. et al., "Burn-in mechanism of 450 nm InGaN ridge laser test structures," Applied Physics Letters 95, 051104 (2009).
Okamoto, K. et al., "Nonpolar m-lane InGaN multiple quantum well laser diodes with a lasing wavelength of 499.8 nm," Applied Physics Letters 94 (2009) 071105.
Queren, D. et al., "500 nm electrically driven InGaN based laser diodes," Applied Physics Letters 94, 081119 (2009).
Ryu, H. et al., "High-performance blue InGaN laser diodes with single-quantum-well active layers," IEEE Photonics Technology Letters, vol. 19, No. 21, Nov. 1, 2007, 1717.
Schmidt, M. et al., "Demonstration of nonpolar m-plane InGaN/GaN laser diodes," Jpn. J. Appl. Phys. 46 (2007) L190.
Speck, J. et al., "Nonpolar and semipolar group III nitride-based materials," MRS Bulletin, vol. 34, May 2009, 304.
Tyagi, A. et al., "Semipolar (1011) InGaN/GaN laser diodes on bulk GaN substrates," Jpn. J. Appl. Phys. 19, 2007, L444.
Tyagi, A. et al., "Partial strain relaxation via misfit dislocation generation at heterointerfaces in (A1,In)GaN epitaxial layers grown on semipolar (1122) GaN free standing substrates," Applied Physics Letters 95, 251905 (2009).
Tyagi, A. et al., "AlGaN-cladding free green semipolar GaN based laser diode with a lasing wavelength of 506.4 nm," Applied Physics Express 3 (2010) 011002.
Steegmueller, U. et al., "Progress in ultra-compact green frequency doubled optically pumped surface emitting lasers," Proc. of SPIE, vol. 7198, 2009, 719807-1.
Yoshizumi, Y. et al., "Continuous-wave operation of 520 nm green InGaN-based laser diodes on semi-polar {2021}GaN substrates," Applied Physics Express 2 (2009) 092101.
Young, E. et al., "Lattice tilt and misfit dislocations in (1122) semipolar GaN heteroepitaxy," Applied Physics Express 3 (2010) 011004.
Powerpoint slides by Po Shan Hsu, entitled "InGaN/GaN Laser Diodes Grown on (30-31) and (30-3-1) Free Standing GaN Substrates" Solid State Lighting and Energy Center Annual Review, University of California, Santa Barbara, Nov. 5, 2010.
International Search Report mailed Apr. 26, 2011, International application No. PC/US2011/027267, International filing date Mar. 4, 2011.
Matsuoka et al., "GaN Growth of Novel Lattice-Matching Substrate: Tilted M-Plane Substrate". Phys. Stat. Sol. (a) 188, No. 2, 2001, pp. 485-489.
Hsu, P.S., et al., "InGaN/GaN Laser Diode Grown on Semipolar (3031) Free-Standing GaN Substrates", Applied Physics Express, 2010, vol. 3, 052702.
Chinese Office Action (with English translation) dated Nov. 18, 2014 for Chinese Patent Application No. 201180012048.9.
Japanese Office Action (with English translation) dated Jan. 6, 2014 for Japanese Patent Application No. 2012-556269.

* cited by examiner

SEMI-POLAR III-NITRIDE OPTOELECTRONIC DEVICES ON M-PLANE SUBSTRATES WITH MISCUTS LESS THAN +/−15 DEGREES IN THE C-DIRECTION

CROSS REFERENCE TO RELATED APPLICATIONS

This application claims the benefit under 35 U.S.C. Section 119(e) of and commonly assigned U.S. Provisional Patent Application Ser. No. 61/310,638 filed on Mar. 4, 2010 by Po Shan Hsu, Kathryn M. Kelchner, Robert M. Farrell, Daniel Haeger, Hiroaki Ohta, Anurag Tyagi, Shuji Nakamura, Steven P. DenBaars, and James S. Speck, entitled "SEMI-POLAR III-NITRIDE OPTOELECTRONIC DEVICES ON M-PLANE SUBSTRATES WITH MISCUTS LESS THAN+/−15 DEGREES IN THE C-DIRECTION,";

which application is incorporated by reference herein.

This application is related to the following co-pending and commonly-assigned U.S. patent applications:

U.S. Utility patent application Ser. No. 12/030,117, filed on Feb. 12, 2008, now U.S. Pat. No. 8,211,723 issued on Jul. 3, 2012, by Daniel F. Feezell, Mathew C. Schmidt, Kwang Choong Kim, Robert M. Farrell, Daniel A. Cohen, James S. Speck, Steven P. DenBaars, and Shuji Nakamura, entitled "Al(x)Ga(1-x)N-CLADDING-FREE NONPOLAR GAN-BASED LASER DIODES AND LEDS,", which application claims the benefit under 35 U.S.C. Section 119(e) of U.S. Provisional Patent Ser. No. 60/889,510, filed on Feb. 12, 2007, by Daniel F. Feezell, Mathew C. Schmidt, Kwang Choong Kim, Robert M. Farrell, Daniel A. Cohen, James S. Speck, Steven P. DenBaars, and Shuji Nakamura, entitled "Al(x)Ga(1-x)N-CLADDING-FREE NONPOLAR GAN-BASED LASER DIODES AND LEDS,";

PCT international Patent Application Serial No. US2010/37629, filed on Jun. 7, 2010, by Arpan Chakraborty, You-Da Lin, Shuji Nakamura, and Steven P. DenBaars, entitled "ASYMMETRICALLY CLADDED LASER DIODE,", which application claims the benefit under 35 U.S.C. Section 119(e) of U.S. Provisional Application Ser. No. 61/184,668, filed Jun. 5, 2009, by Arpan Chakraborty, You-Da Lin, Shuji Nakamura, and Steven P. DenBaars, entitled "ASYMMETRICALLY CLADDED LASER DIODE,"; and U.S. Utility application Ser. No. 12/795,390, filed on Jun. 7, 2010, by Arpan Chakraborty, You-Da Lin, Shuji Nakamura, and Steven P. DenBaars, entitled "LONG WAVELENGTH NONPOLAR AND SEMIPOLAR (Al,Ga,In)N BASED LASER DIODES,", which application claims the benefit under 35 U.S.C. Section 119(e) of and commonly assigned U.S. Provisional Application Ser. No. 61/184,729, filed on Jun. 5, 2009, by Arpan Chakraborty, You-Da Lin, Shuji Nakamura, and Steven P. DenBaars, entitled "LONG WAVELENGTH m-PLANE (Al,Ga,In)N BASED LASER DIODES,";

which applications are incorporated by reference herein.

BACKGROUND OF THE INVENTION

1. Field of the Invention

This invention relates to semi-polar optoelectronic devices and methods of fabrication thereof, and in particular, semi-polar III-nitride optoelectronic devices on m-plane substrates with miscuts less than +/−15 degrees in the c-direction.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

The anticipated high commercial demand for next-generation display technologies, such as miniature mobile projectors and high-definition fly-spot displays, has significantly accelerated the development of direct-emission green laser diodes (LDs). Technical criteria for such applications require LDs to have high efficiency, reliability, compactness, and modulation response capabilities [1]. While the wurtzite (Al,Ga,In)N-based material system is largely agreed upon as the leading candidate for green optoelectronic devices, a general consensus behind which crystal plane is optimal for epitaxial growth has yet to be reached.

Continuous-wave (CW) operation of LDs in the green spectral region has been demonstrated for devices grown on the conventional c-plane of GaN [2-4]. These devices, however, suffer from parasitic internal electric fields that give rise to the quantum-confined stark effect (QCSE) which decreases the quantum-well (QW) radiative recombination rate, and causes a blue-shift in emission wavelength with increasing carrier injection [5]. In addition, QCSE becomes more significant for long wavelength optoelectronic devices due to the increased lattice mismatch between the In-rich InGaN QWs and the barrier [2].

To circumvent polarization effects, researchers have demonstrated operation of LDs grown on the nonpolar m-plane orientation of the wurtzite crystal [6]. While a promising candidate for high power blue LDs, m-plane LDs has so far been limited to 500 nm lasing emission due to the formation of stacking faults in the active region [7-11].

Various semi-polar (or semipolar) planes, such as (10-11) and (11-22), have been also investigated as alternative growth planes [12-13]. Recently, researchers have reported lasing in the green spectral region from high quality InGaN QWs grown on the semi-polar (20-21) plane [14-15]. Further studies have shown that green emitting QWs grown on (20-21) exhibit high compositional homogeneity with localization energy values lower than that reported for c-plane [16]. However, quaternary AlInGaN cladding layers were needed in (20-21) LDs to achieve sufficient modal confinement without generating strain-induced misfit dislocations (MDs) [17]. While the use of quaternary AlInGaN cladding layers presents a solution for semi-polar planes with low critical thickness, a simple AlGaN cladding-free structure with high composition InGaN waveguides would be much more attractive from a mass-production point of view [7, 15, 18].

What is needed are improved methods for optoelectronic device growth. The present invention satisfies this need.

SUMMARY OF THE INVENTION

The present invention discloses a semi-polar (Al,Ga,In)N based optoelectronic device grown on a GaN substrate with a miscut x degrees from the m-plane in the c-direction (where −15<x<−1 and 1<x<15 degrees).

Such optoelectronic devices, on an m-plane with x degrees of miscut towards the c-direction (where −15<x<−1 and 1<x<15 degrees), provide lower QCSE induced injection-current dependent blue-shift, increased oscillator strength leading to higher material gain, etc., compared to miscuts larger or equal to +/−15 degrees towards the c-direction.

Lower miscut away from the m-plane provides for larger critical thickness of layers grown on the miscut. This may reduce the number of misfit defects in the layers grown on the miscut, as compared to layers grown on semi-polar planes which provide lower critical thickness. The defect density in the layers may then be dependent on the semi-polar plane on which the layers are deposited.

For example, the optoelectronic device may comprise one or more semiconductor III-Nitride layers grown on a semi-polar (or semipolar) plane, or semi-polar crystal plane of GaN, that is a {30-3-1}, {30-31}, {40-41}, or {40-4-1} plane, wherein the semi-polar plane or semi-polar crystal plane of GaN is a top surface of a vicinal, miscut, or off-axis free standing GaN substrate, for example.

The semi-polar GaN plane may comprise an atomically specific plane, so that a smooth epitaxial growth is achieved.

The method may include selecting the semi-polar crystal plane in order to increase a critical thickness of the III-Nitride layers grown on the semi-polar crystal plane. For example, the III-Nitride layers of the optoelectronic device may comprise one or more InGaN layers having a thickness greater than, or equal to, a Mathews-Blakeslee's critical thickness, wherein the critical thickness is for an InGaN layer deposited on a semi-polar crystal plane of GaN oriented 15 degrees or more from an m-plane of the GaN and in a c-direction of the GaN. The InGaN layers may have an Indium composition of at least 7%.

The optoelectronic device may be a LD and the one or more InGaN layers may comprise an InGaN waveguide that provides a modal confinement for the LD, the LD having a lasing peak at a wavelength of at least 460 nm, for example.

The optoelectronic device may further include a light emitting InGaN active layer including one or more InGaN quantum wells, one or more of the quantum wells having an Indium composition of at least 16% (and a thickness greater than 4 nanometers (nm)).

The optoelectronic device may further comprise one or more n-type (Al,In,Ga)N layers; one or more p-type (Al,In,Ga)N layers; and an InGaN active layer comprising one or more InGaN quantum well layers between the n-type (Al,In,Ga)N layers and the one or more p-type (Al,In,Ga)N layers, wherein the n-type (Al,In,Ga)N layers, the p-type (Al,In,Ga)N layers, the InGaN quantum well layers have a semi-polar orientation of the semi-polar GaN crystal plane, and the InGaN quantum well layers have a peak light emission or a peak light absorption at a wavelength of at least 477 nm.

The optoelectronic device may be a LD comprising an n-type GaN layer on or above the semi-polar crystal plane; an n-type InGaN waveguiding layer on or above the n-type GaN layer, the n-type InGaN waveguiding layer having a thickness of at least 50 nm and an Indium composition of 7% or more; an InGaN active layer on or above the n-type InGaN waveguiding layer, including one or more InGaN quantum well layers with an Indium composition of at least 7% and a thickness of more than 4 nm; a p-type InGaN waveguiding layer on or above the InGaN active layer; and a p-type GaN layer on or above the p-type InGaN waveguiding layer, the p-type InGaN waveguiding layer having a thickness of at least 50 nm and an Indium composition of 7% or more, wherein the n-type GaN layer, the n-type InGaN waveguiding layer, the InGaN active layer, the p-type GaN layer, and the p-type InGaN waveguiding layer have a semi-polar orientation of the semi-polar crystal plane.

The semi-polar crystal plane and the depositing conditions may be such that one or more of the III-Nitride layers have a surface roughness of 0.75 nm or less, for example.

The LD may comprise a waveguide oriented in a c-projection direction of the LD, for higher gain.

The device grown on the semi-polar GaN crystal plane includes, but is not limited to, a LD, light emitting diode (LED), superluminescent diode (SLD), semiconductor amplifier, photonic crystal laser, VCSEL laser, solar cell, or photodetector, for example.

The present invention further discloses a method of fabricating an optoelectronic device, comprising depositing III-Nitride layers epitaxially on a semi-polar GaN crystal plane oriented x degrees from an m-plane of the GaN and in a c-direction of the GaN, where −15<x<−1 and 1<x<15 degrees. The method may further comprise selecting the semi-polar crystal plane in order to increase a critical thickness of the III-Nitride layers grown on the semi-polar crystal plane.

BRIEF DESCRIPTION OF THE DRAWINGS

Referring now to the drawings in which like reference numbers represent corresponding parts throughout:

FIG. 7(b) shows a clear lasing peak at 444.7 nm.

DETAILED DESCRIPTION OF THE INVENTION

Figure 1A:
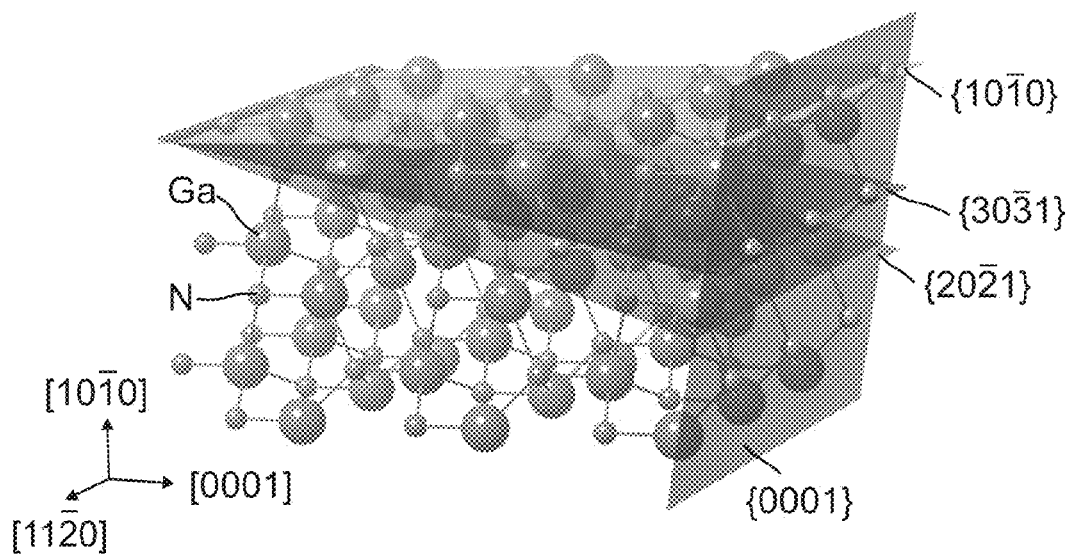
FIG. 1(a) is a schematic of the wurtzite GaN crystal structure showing the {10-10}, {30-31}, {20-21}, and {0001} planes.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview (Al,Ga,In)N optoelectronic devices are grown on polar {0001}, non-polar {11-20} and {10-10}, and semi-polar {10-1-1}, {11-22} and {20-21} GaN crystal planes.

Lasers grown on polar and semi-polar planes suffer from polarization related electric fields in the quantum-wells that degrade device performance.

While non-polar {10-10} and {11-20} devices are free from polarization related effects, incorporation of high indium concentrations in {10-10} and high quality crystal growth of {11-20} devices have been shown to be difficult to achieve.

For example, sufficiently long wavelength emitting optoelectronic devices on m-plane are difficult to achieve due to generation of defects at high indium compositions. Semi-polar planes, such as {20-21}, show better performance at long wavelength since semi-polar planes are believed to incorporate indium more easily. However, semi-polar planes with miscut larger or equal to +/−15 degrees have low critical thicknesses thus making growth of sufficient waveguide structures for lasers very difficult. Sumitomo's green laser on {20-21} [14] uses lattice matched AlInGaN cladding layers which are very difficult to grow.

Nomenclature

GaN and its ternary and quaternary compounds incorporating aluminum and indium (AlGaN, InGaN, AlInGaN) are commonly referred to using the terms (Al,Ga,In)N, III-nitride, Group III-nitride, nitride, $Al_{(1-x-y)}In_yGa_xN$ where $0<x<1$ and $0<y<1$, or AlInGaN, as used herein. All these terms are intended to be equivalent and broadly construed to include respective nitrides of the single species, Al, Ga, and In, as well as binary, ternary and quaternary compositions of such Group III metal species. Accordingly, these terms comprehend the compounds AlN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention. Accordingly, it will be appreciated that the discussion of the invention hereinafter in primary reference to GaN materials is applicable to the formation of various other (Al, Ga, In)N material species. Further, (Al,Ga, In)N materials within the scope of the invention may further include minor quantities of dopants and/or other impurity or inclusional materials. Boron (B) may also be included.

The term "$Al_xGa_{1-x}N$-cladding-free" refers to the absence of waveguide cladding layers containing any mole fraction of Al, such as $Al_xGa_{1-x}N$/GaN superlattices, bulk $Al_xGa_{1-x}N$, or AlN. Other layers not used for optical guiding may contain some quantity of Al (e.g., less than 10% Al content). For example, an $Al_xGa_{1-x}N$ electron blocking layer may be present.

One approach to eliminating the spontaneous and piezoelectric polarization effects in GaN or III-nitride based optoelectronic devices is to grow the III-nitride devices on non-polar planes of the crystal. Such planes contain equal numbers of Ga (or group III atoms) and N atoms and are charge-neutral. Furthermore, subsequent nonpolar layers are equivalent to one another so the bulk crystal will not be polarized along the growth direction. Two such families of symmetry-equivalent nonpolar planes in GaN are the {11-20} family, known collectively as a-planes, and the {1-100} family, known collectively as m-planes. Thus, nonpolar III-nitride is grown along a direction perpendicular to the (0001) c-axis of the III-nitride crystal.

Another approach to reducing polarization effects in (Ga, Al,In,B)N devices is to grow the devices on semi-polar planes of the crystal. The term "semi-polar plane" (also referred to as "semipolar plane") can be used to refer to any plane that cannot be classified as c-plane, a-plane, or m-plane. In crystallographic terms, a semi-polar plane may include any plane that has at least two nonzero h, i, or k Miller indices and a nonzero l Miller index.

Technical Description

The design of LD structure on semi-polar GaN crystal planes is unique due to the possibility of forming stress-relieving Misfit Dislocations (MDs) at the hetero-interface(s) via glide of pre-existing threading dislocations (TDs) on the basal (0001) plane [19]. The driving force for such TD glide originates from the resolved shear stress on the basal plane—the magnitude of which decreases with increasing inclination angle of the semi-polar plane away from the basal (0001) plane [20]. Therefore, hetero-epitaxial growth of strained (Al,Ga,In)N layers on semi-polar planes with an inclination angle between 80 and 90 degrees (with respect to the c-plane) should lead to a dramatic reduction in the resolved shear stress on the basal plane and a concomitant increase in epilayer critical thickness.

Figure 1B:
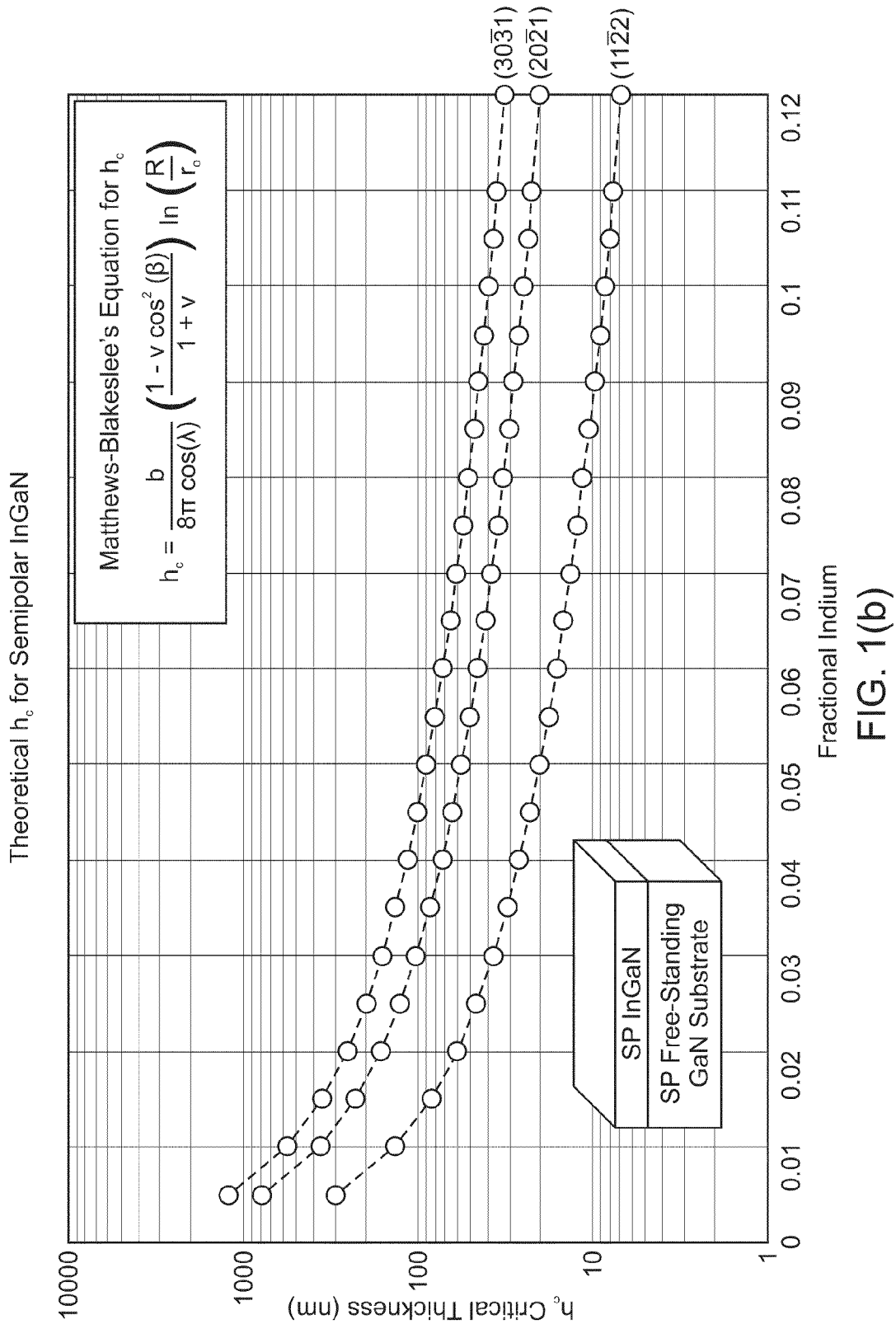
FIG. 1(b) is a graph plotting the Matthews-Blakeslee's critical thickness of a semi-polar InGaN layer on a free standing semi-polar GaN substrate, calculated using the Matthews-Blakeslee equation.

As shown in FIG. 1(a), the {30-31} GaN semi-polar plane is inclined 5 and 10 degrees away in the c-direction from the semi-polar GaN {20-21} plane and nonpolar GaN {10-10} m-plane, respectively. Also shown in FIG. 1(a) are the {0001} plane, the GaN [10-10] direction, the GaN [0001] direction, the GaN [11-20] direction, the Ga atoms and the N atoms. Matthews-Blakeslee equilibrium critical thickness $h_c$ [21] values (calculated under the assumption of isotropic elasticity) for $In_{0.06}Ga_{0.94}N$ epitaxially grown on the (11-22), (20-21), and (30-31) GaN semi-polar planes are 17, 46 and 74 nm, respectively, as shown in FIG. 1(b). The larger critical thickness on (30-31) frees up considerable epilayer LD waveguide design space in comparison to other previously investigated semi-polar planes. The critical thickness $h_c$ in FIG. 1(b), for a semi-polar (SP) InGaN layer on a semi-polar (SP) free standing GaN substrate was calculated using the Matthew's Blakeslee's Equation for $h_c$ [21]:

$$h_c = \frac{b}{8\pi\cos\lambda}\left(\frac{1-v\cos^2\beta}{1+v}\right)\ln\left(\frac{R}{r_0}\right)$$

where b is the Burgers vector, v is Poisson's ratio, λ is the angle between the Burger's vector and the direction that is both normal to the dislocation line and that lies within the plane of the interface, β is the angle between the Burger's vector and the dislocation line, and $r_0$ and R are the inner and outer radii of the cylindrical ring surrounding a straight dislocation core, respectively.

The present invention discloses semi-polar III-nitride optoelectronic devices on m-plane substrates with miscuts less than +/−15 degrees in the c-direction. For example, the invention demonstrates the possibility of superior laser performance by growing laser structures on m-plane substrates miscut x degrees in the c-direction (where −15<x<−1 and 1<x<15 degrees).

Process Steps

Figure 2:
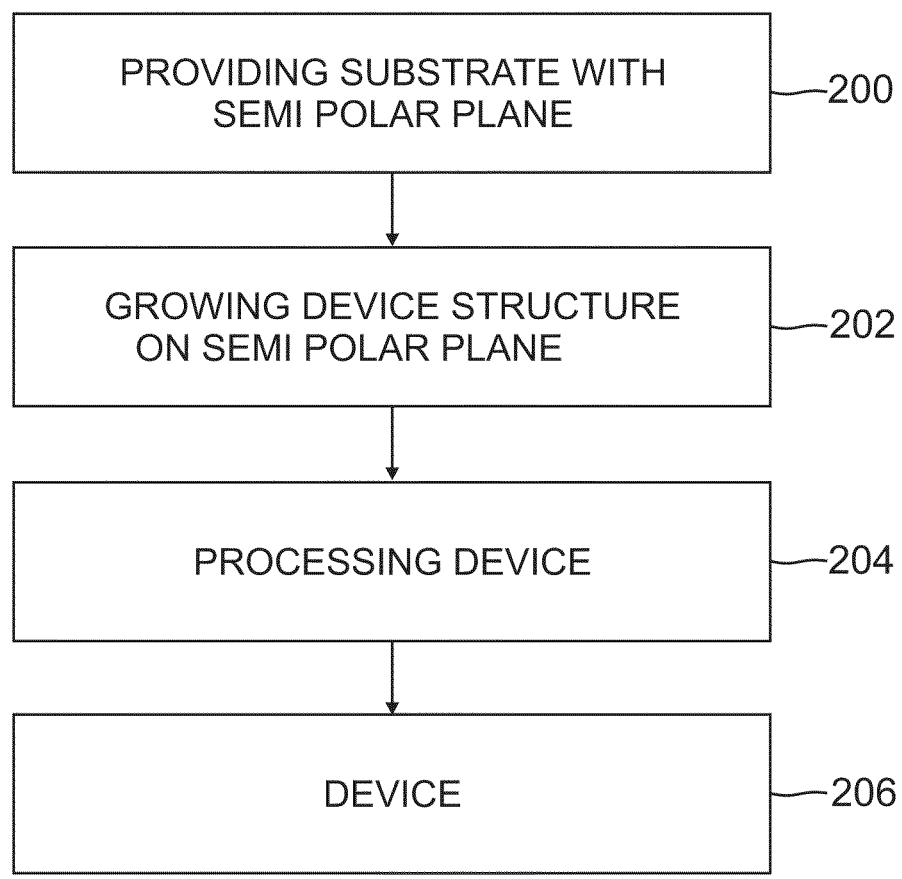
FIG. 2 is a flowchart illustrating a method of the present invention.

FIG. 2 illustrates a method of fabricating a device. The method may comprise the following steps.

Block 200 represents providing a semi-polar GaN crystal plane oriented or miscut x degrees from an m-plane of the GaN, and in a c-direction of the GaN, where −15<x<−1 and 1<x<15 degrees. The GaN crystal plane may be on a GaN substrate (e.g., free standing substrate). The semi-polar GaN crystal plane may be provided by miscutting, cutting, or sawing the GaN substrate, or otherwise obtaining a miscut or vicinal GaN substrate so that miscut or vicinal surface may include the semi-polar GaN crystal plane. Low-defect density free-standing GaN substrates provided by Mitsubishi Chemical Corporation may be used, for example. The step may further comprise selecting the semi-polar crystal plane in order to increase a critical thickness of the III-Nitride layers grown on the semi-polar crystal plane.

Block 202 represents depositing or growing (e.g., epitaxially) a device, such as an optoelectronic device comprising one or more III-Nitride layers, on the semi-polar GaN crystal plane, on the miscut of GaN or of the GaN substrate, or on the vicinal surface of GaN or of the GaN substrate (wherein the miscut or vicinal surface includes the semi-polar GaN crystal plane). The semi-polar GaN crystal plane may be miscut or oriented x degrees from an m-plane of the GaN and in a c-direction, where −15<x<−1 and 1<x<15 degrees.

The optoelectronic device may comprise one or more III-Nitride or (Al,In,Ga)N (e.g., InGaN) layers having a thickness greater than, or equal to, a Mathews-Blakeslee's critical thickness, wherein the critical thickness is for InGaN layer(s) (having the same Indium composition) deposited on a semi-polar crystal plane of GaN oriented 15 degrees or more from an m-plane of the GaN and in a c-direction of the GaN. The (Al,In,Ga)N layers or InGaN layers may have an Indium composition of at least 7%. The (Al,In,Ga)N layers may comprise an entire epilayer thickness of the optoelectronic device. The InGaN layers may comprise waveguiding layers, an active layer, or both. The InGaN active layers may comprise one or more light emitting or absorbing quantum well layers (e.g., multi quantum well layers), wherein a total thickness of the active layer (e.g., total thickness of the multi quantum wells) has the thickness greater than the critical thickness for a semi-polar plane oriented 15 degrees or more from an m-plane of GaN in a c-direction.

The optoelectronic device may comprise a LD and the one or more InGaN layers may comprise an InGaN waveguide that provides a modal confinement for the LD, the LD having a lasing peak at a wavelength of at least 445 nm, at least 460 nm, or at least 478 nm, for example.

The III-Nitride layers may further include a light emitting InGaN active layer including one or more InGaN quantum wells, one or more of the quantum wells having an Indium composition of at least 7%, at least 10%, or at least 16%, and a thickness greater than 4 nanometers (e.g., 5 nm), at least 5 nm, or at least 8 nm, for example. However, the quantum well thickness may also be less than 4 nm, although it is typically above 2 nm thickness.

The depositing of the III-Nitride layers may further comprise depositing one or more n-type (Al,In,Ga)N layers on the semi-polar GaN crystal plane, depositing an InGaN active layer comprising the one or more InGaN quantum well layers (between barrier layers) on or above the one or more n-type (Al,In,Ga)N layers, and depositing one or more p-type (Al,In,Ga)N layers on the InGaN quantum well layers, wherein the III-Nitride layers (e.g., n-type (Al,In,Ga)N layers, the p-type (Al,In,Ga)N layers, and the InGaN quantum well layers) have a semi-polar orientation of the semi-polar GaN crystal plane, and the InGaN quantum well layers have a peak light emission or a peak light absorption at a wavelength of at least 477 nm. However, the layers may be deposited in the opposite order, such that the p-type layers are on the semipolar crystal plane and below the active layer, and the n-type layers are above the active layer.

The optoelectronic device may be a LD fabricated by depositing an n-type GaN layer on or above the semi-polar GaN crystal plane; depositing an n-type InGaN waveguiding layer on or above the n-type GaN layer, the n-type InGaN waveguiding layer having a thickness of at least 50 nm and an Indium composition of 7% or more; depositing an InGaN active layer on or above the n-type InGaN waveguiding layer, the active layer including barrier layers and one or more InGaN quantum well layers with an Indium composition of at least 7% and a thickness of more than 4 nm (the InGaN quantum well layers between the barrier layers); depositing a p-type InGaN waveguiding layer on or above the InGaN quantum wells; and depositing a p-type GaN layer on or above the p-type InGaN waveguiding layer, the p-type InGaN waveguiding layer having a thickness of at least 50 nm and an Indium composition of 7% or more, wherein the III-Nitride layers (e.g., n-type GaN layer, the n-type InGaN waveguiding layer, the InGaN active layer, the p-type GaN layer, and the p-type InGaN waveguiding layer) have a semi-polar orientation of the semi-polar crystal plane.

In one embodiment, the LD may be AlGaN cladding layer free, in other words, the laser diode may not contain any AlGaN cladding layers, or wherein any AlGaN layers in the device do not confine the optical mode of the device (e.g., the AlGaN layers in the device may have an Al content less than or equal to 10%).

Figure 3A:
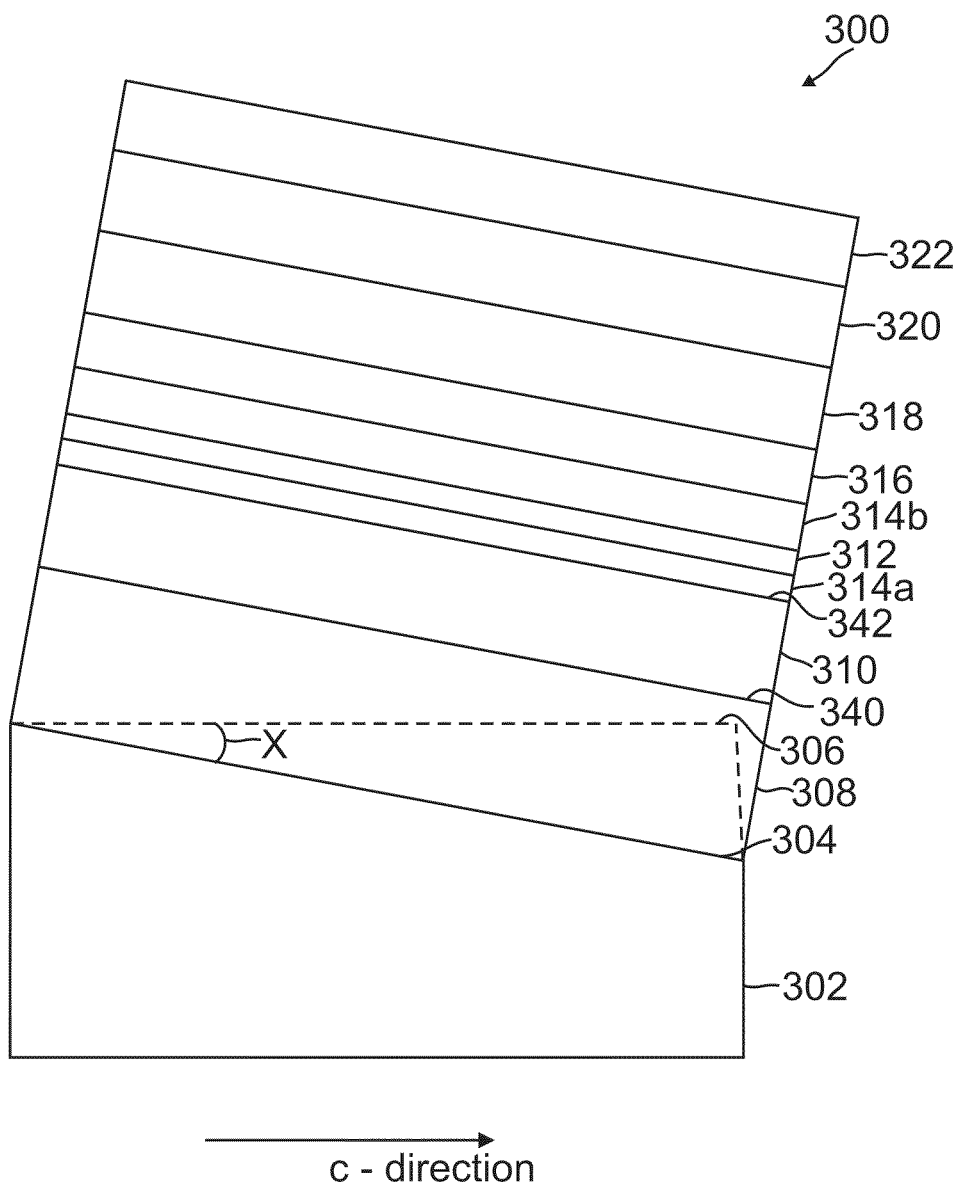
FIG. 3(a) illustrates a cross-section of a prototype laser device structure.

FIG. 3(a) illustrates a prototype laser device structure 300 that was epitaxially grown on a {30-31} GaN substrate 302 (where x=10 degrees) or a {30-3-1} GaN substrate 302 (where x=−10 degrees) using metal organic chemical vapor deposition (MOCVD), e.g., atmospheric pressure MOCVD (AP-MOCVD). The device structure 300 is grown on a top surface 304 of the GaN substrate 302, wherein the top surface 304 is oriented x degrees with respect to the m-plane 306 of the GaN substrate 300. For example, the surface 304 may be a {30-31} plane or {30-3-1} plane. The device 300 is AlGaN cladding-free and the MOCVD growth conditions employed for growing the (30-31) the LD structure were similar to that typically used for c-plane, m-plane, and (20-21) growths.

The structure 300 comprises a thick lower GaN cladding layer 308 (e.g., n-type GaN layer on or above the semi-polar GaN crystal plane 304), a Si-doped InGaN waveguiding layer 310 (e.g., 50 nm thick n-type InGaN waveguiding layer 310 on or above the n-type GaN layer 308), an active layer on or above the n-type InGaN waveguiding layer 310, the active layer including three periods of an undoped InGaN quantum well (e.g., 5 nm thick) 312 sandwiched between GaN barriers 314a, 314b (e.g., 10 nm thick), an AlGaN electron blocking layer (EBL) 316, an Mg-doped InGaN upper waveguiding layer 318 (e.g., 50 nm thick p-type InGaN waveguiding layer on or above the quantum wells 312), an Mg-doped upper GaN cladding layer 320 (e.g., p-type GaN layer), and an Mg-doped GaN p++ contact layer 322 [7]. The n-type GaN 308, n-type InGaN 310, active region 312, 314a, 314b, and p-type InGaN 318, were grown under $N_2$ ambient. The p-type GaN 320 was grown under $H_2$ ambient. The entire device was grown under high V/III ratio (>150). The structure and growth conditions are similar to those described in [7].

In one or more examples, the semi-polar crystal plane 304 and the depositing conditions may be such that one or more of the III-Nitride layers 308-322 have a surface roughness of 0.75 nm or less.

Figure 3B:
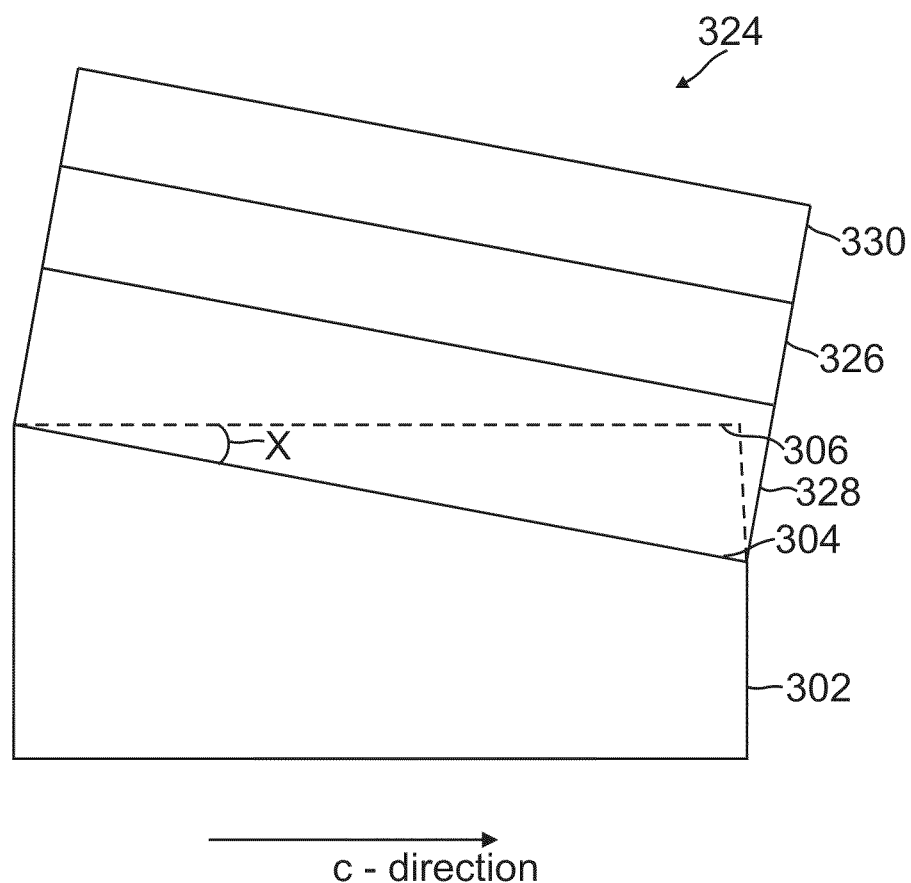
FIG. 3(b) illustrates a cross-section of another embodiment of a device structure.

FIG. 3(b) illustrates another embodiment of a device structure 324, grown during Block 202 on a semi-polar plane 304 of Block 200, wherein the device structure comprises one or more III-nitride or (Al,Ga,In)N active layers 326 (e.g., one or more InGaN quantum wells) between one or more n-type III-nitride or (Al,Ga,In)N layers 328 and one or more p-type III-nitride or (Al,Ga,In)N layers 330. For example, the n-type III-Nitride layers 328 may be on or above the semi-polar GaN crystal plane 304, the III-Nitride active layer 326 may be on or above the n-type III-Nitride layers 328, and the p-type III-Nitride layers 330 may be on or above the III-Nitride active layers 326. In one embodiment, the position of the n-type 328 and p-type 330 layers may be reversed. Also shown in FIG. 3(a) and FIG. 3(b) is the c-direction of the GaN substrate 302.

The semi-polar crystal plane 304 may be a {30-31}, {30-3-1}, {40-41}, or {40-4-1} plane, for example. The semi-polar GaN crystal plane 304 provided in Block 200 may be a top surface of a vicinal, miscut, or off-axis free standing GaN substrate 302, for example, and the semi-polar GaN plane 304 may comprise an atomically specific plane, so that a smooth epitaxial growth of the III-Nitride layers (e.g., 308-322, 326, 328, 330) is achieved. For example, one or more of the III-Nitride layers 308-322, 326, 328, 330 may have a surface roughness of 0.75 nm or less. The present invention is not limited to a particular thickness of the III-Nitride layers. The III-Nitride layers are not limited to a particular type of device layer, the III-Nitride active layers 326 are not limited to quantum wells or a particular type of active layer. For example, the III-Nitride layers of the optoelectronic device may be device layers for a solar cell, photodetector, etc., and the active layers 326 may be active layers for a solar cell, photodetector, etc.

Block 204 represents processing the device (e.g., including forming mirror facets). Ridge-waveguide laser structures are fabricated using conventional photolithography, dry-etching, and lift-off techniques. For example, in one embodiment, the laser device structure of Block 202 was processed into a 10 μm by 1800 μm ridge waveguide LD using conventional photolithographic and dry etching techniques. A self-aligned dry etch and lift-off process was used to define the ridge waveguide and oxide insulator, and followed by 50/1000 nm Pd/Au metallization for the p-contact. Mirror facets were formed orthogonal to the in-plane projection of the c-axis by standard $Cl_2$ based reactive ion etching. Backside Al/Au n-contacts were deposited directly onto the bulk substrate.

Block 206 represents the end result of the method, a device or optoelectronic device such as a laser diode or LED, grown on a semi-polar plane 304 or a semi-polar GaN crystal plane 304 (e.g., on a miscut GaN substrate 302), wherein the semi-polar plane 304 or semipolar GaN crystal plane 304 is miscut or oriented x degrees from an m-plane 306 of the GaN and in a c-direction of the GaN, where −15<x<−1 and 1<x<15 degrees. For example, an optoelectronic device may be grown on a miscut of GaN, wherein the miscut includes the semi-polar GaN crystal plane 304 miscut x degrees from an m-plane 306 of the GaN and in a c-direction of the GaN, where −15<x<−1 and 1<x<15 degrees.

Figure 3C:
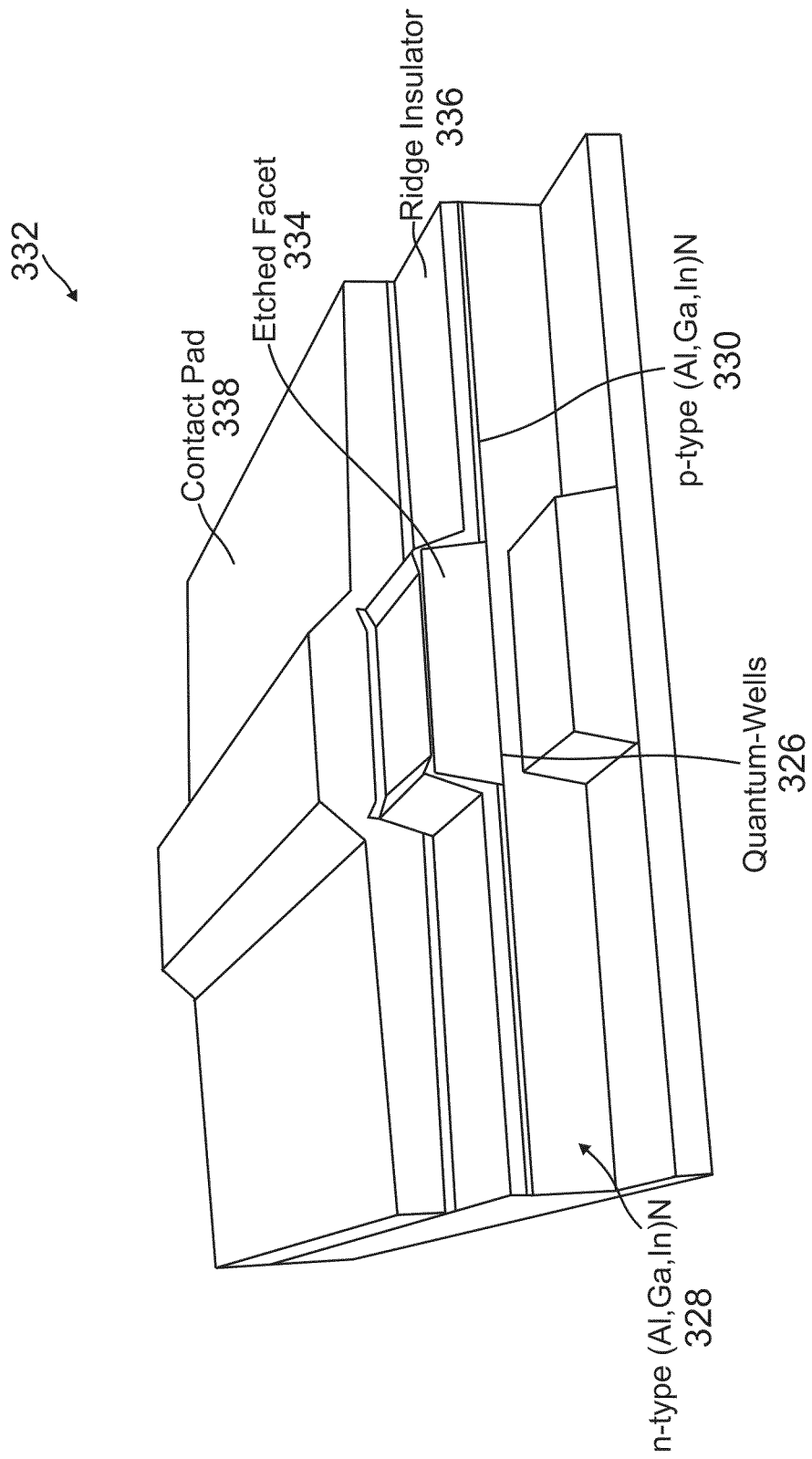
FIG. 3(c) is a cross-sectional schematic of a finished laser device structure with etched facets.

FIG. 3(c) is a cross-sectional schematic of a finished laser device structure 332 of Block 206 with etched facets 334 (e.g., etched facet mirrors), ridge insulator 336, and p-contact pad 338. The LD may be on {30-31}, for example. The optoelectronic device may be an AlGaN cladding layer free LD comprising an InGaN waveguide that is thick enough to provide modal confinement.

EXPERIMENTAL RESULTS

Morphological and Structural Qualities

The morphological and structural qualities of the LD structure were characterized by repeating the identical growth conditions on separate (30-31) GaN substrates. Inconsistencies between separate MOCVD growths were shown to be minimal via photoluminescence measurements.

Figure 4A:
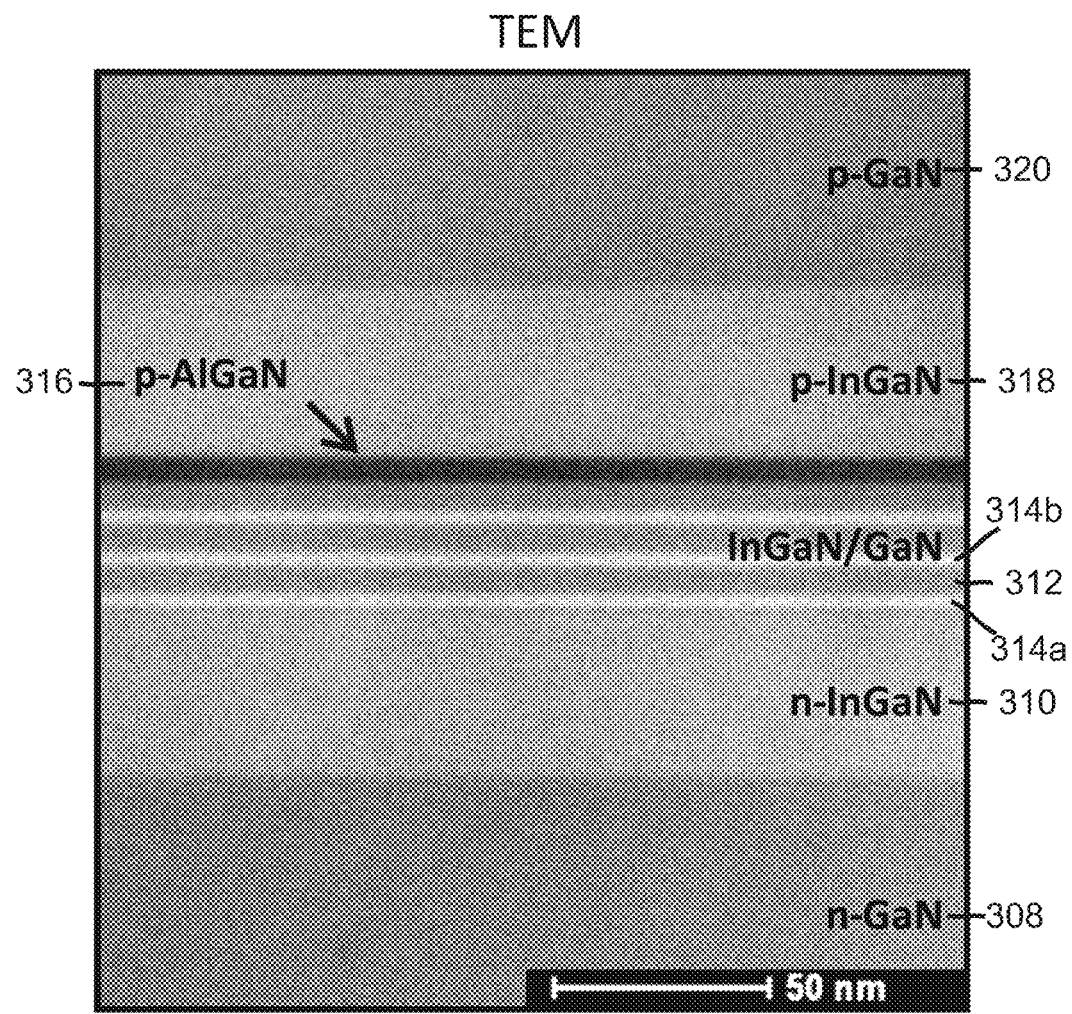
FIG. 4(a) shows a Transmission Electron Microscope (TEM) image of the structure of FIG. 3(a) grown on a (30-31) semi-polar crystal plane.

FIG. 4(a) shows a TEM image of the structure of FIG. 3(a) grown on a (30-31) semipolar crystal plane 304, showing high quality interfaces with no apparent defects. FIG. 4(a) shows n-type GaN layer 308 (n-GaN), n-type InGaN layer 310 (n-InGaN), InGaN quantum wells 312 with GaN barriers 314a, 314b (InGaN/GaN), p-type AlGaN EBL (p-AlGaN), p-type InGaN layer 318 (p-InGaN), and p-type layer 320 (p-GaN).

Figures 4B, 4C:
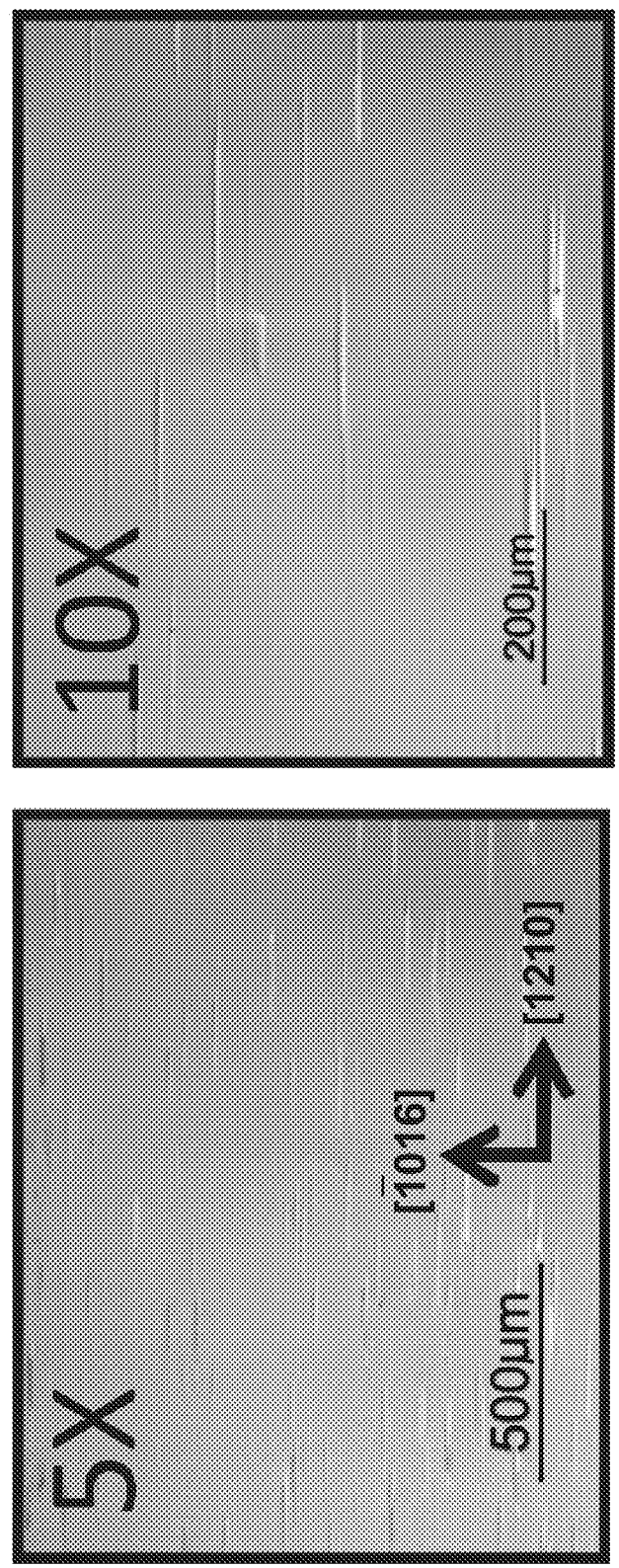
FIG. 4(b) and FIG. 4(c) show Nomarski images taken at 5× (FIG. 4(b)) and 10× (FIG. 4(c)) showing the morphology of the (30-31) growth surface.

FIG. 4(b) and FIG. 4(c) show Nomarski images of the (30-31) top surface 340 (opposite or parallel to surface 304) of n-type GaN layer 308 in the device structure of FIG. 3(a), with obvious striations running along the [11-22] direction, which the present invention attributes to unoptimized growth conditions.

Figure 4D:
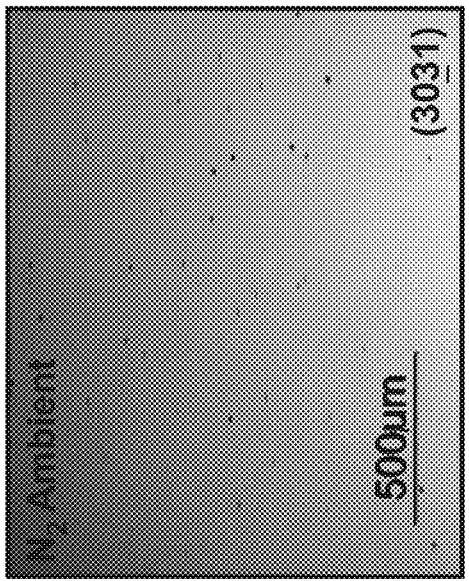
FIG. 4(d) and FIG. 4(e) are Nomarski images of the top surface of a layer in the structure of FIG. 3(a) grown by MOCVD on a (30-31) semi-polar crystal plane using $N_2$ ambient (FIG. 4(d)) and $H_2$ ambient (FIG. 4(e)).
Figure 4E:
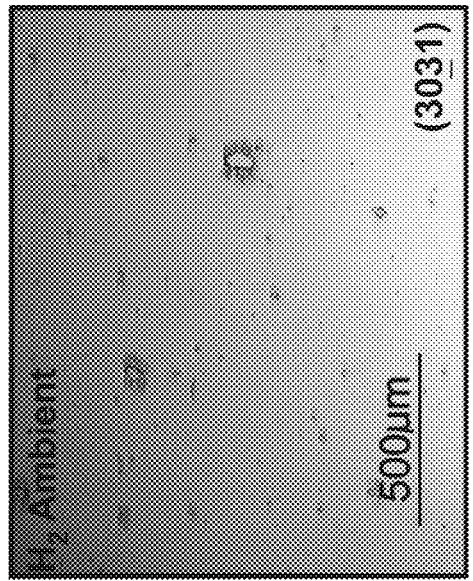

FIG. 4(d)-FIG. 4(g) show how surface morphology may be optimized by growth conditions. FIG. 4(d) and FIG. 4(e) are Nomarski images of the top surface 340 of n-type GaN layer 308 in the device structure of FIG. 3(a), grown by MOCVD on a (30-31) semipolar crystal plane 304 using $N_2$ ambient (FIG. 4(d)) and $H_2$ ambient (FIG. 4(e)).

Figure 4F:
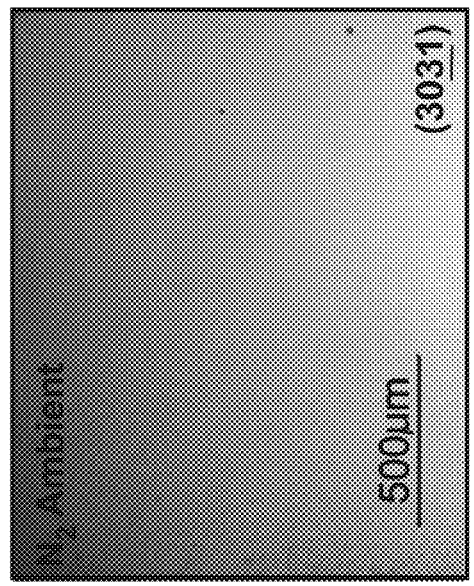
FIG. 4(f) and FIG. 4(g) are Nomarski images of the top surface of a layer in the structure of FIG. 3(a) grown by MOCVD on a (30-3-1) semi-polar crystal plane using $N_2$ ambient (FIG. 4(f)) and $H_2$ ambient (FIG. 4(g)).
Figure 4G:
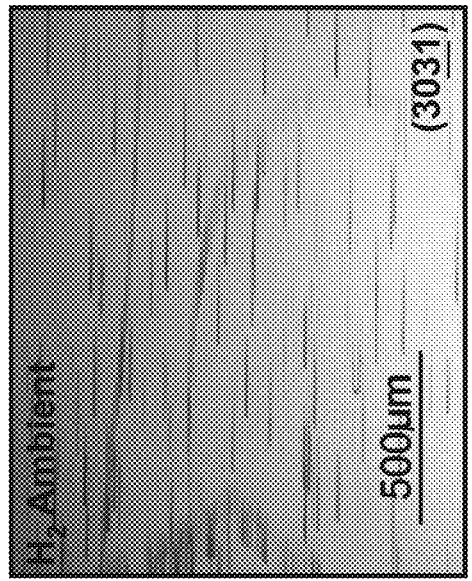

FIG. 4(f) and FIG. 4(g) are Nomarski images of the top surface 340 of n-type GaN layer 308 in FIG. 3(a) grown by MOCVD on a (30-3-1) semipolar crystal plane 304 using $N_2$ ambient (FIG. 4(f)) and $H_2$ ambient (FIG. 4(g)).

The 50 nm thick InGaN layer (e.g., layer 310) on the (30-3-1) plane 304, has a top (30-3-1) plane surface 342, wherein the top surface 342 has a root mean square (RMS) roughness of 0.75 nm. However, the RMS roughness may be higher or lower. The 50 nm thick InGaN layer 310 was grown under $N_2$ ambient on the GaN 308 and the GaN 308 was grown under $N_2$ ambient at high temperature (e.g., approximately 900° C.).

Figure 5:
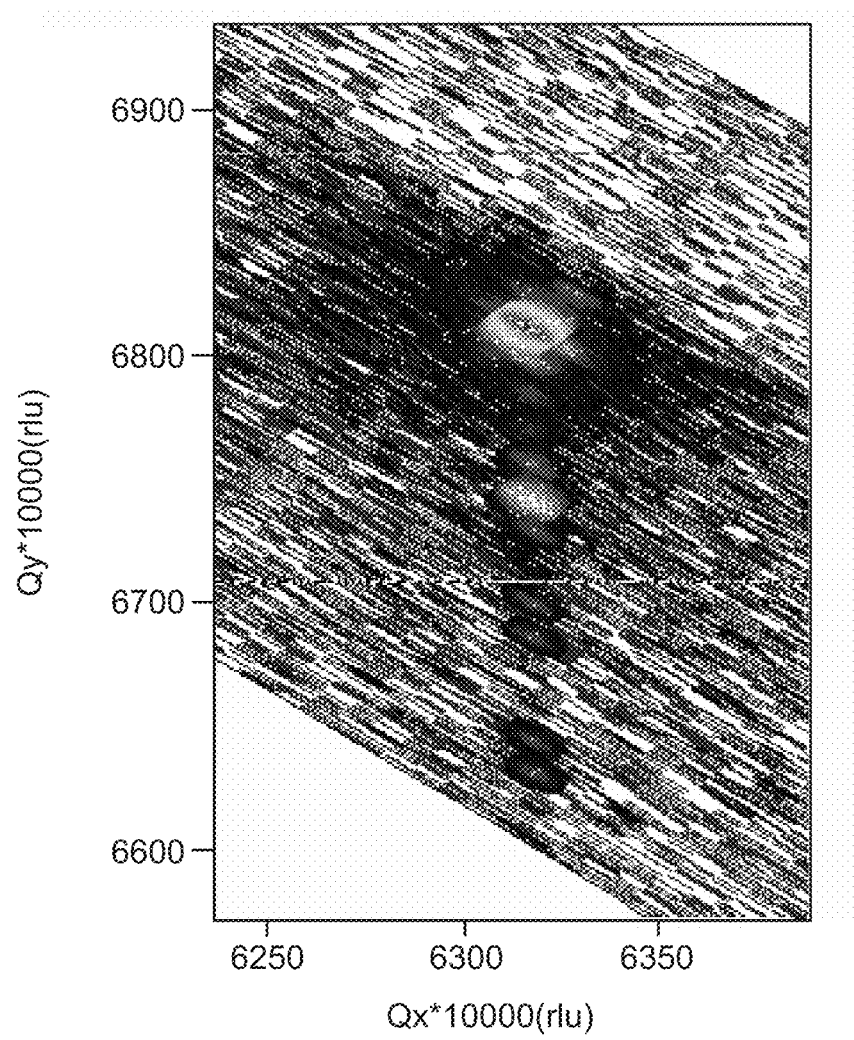
FIG. 5 is a Reciprocal space map (RSM) around the asymmetrical (20-25) diffraction of the (30-31) LD structure.

FIG. 5 shows the x-ray reciprocal space mapping (RSM) of the LD structure 300 of FIG. 3(a) around the asymmetrical (20-25) diffraction of the (30-31) plane. As seen in the RSM, the Bragg peaks for all layers in the LD structure line up vertically on the $Q_x$ axis, suggesting that the LD structure is coherently strained.

Output Characteristics

All electrical and luminescence measurements were made on devices with uncoated mirror facets.

Figure 6A:
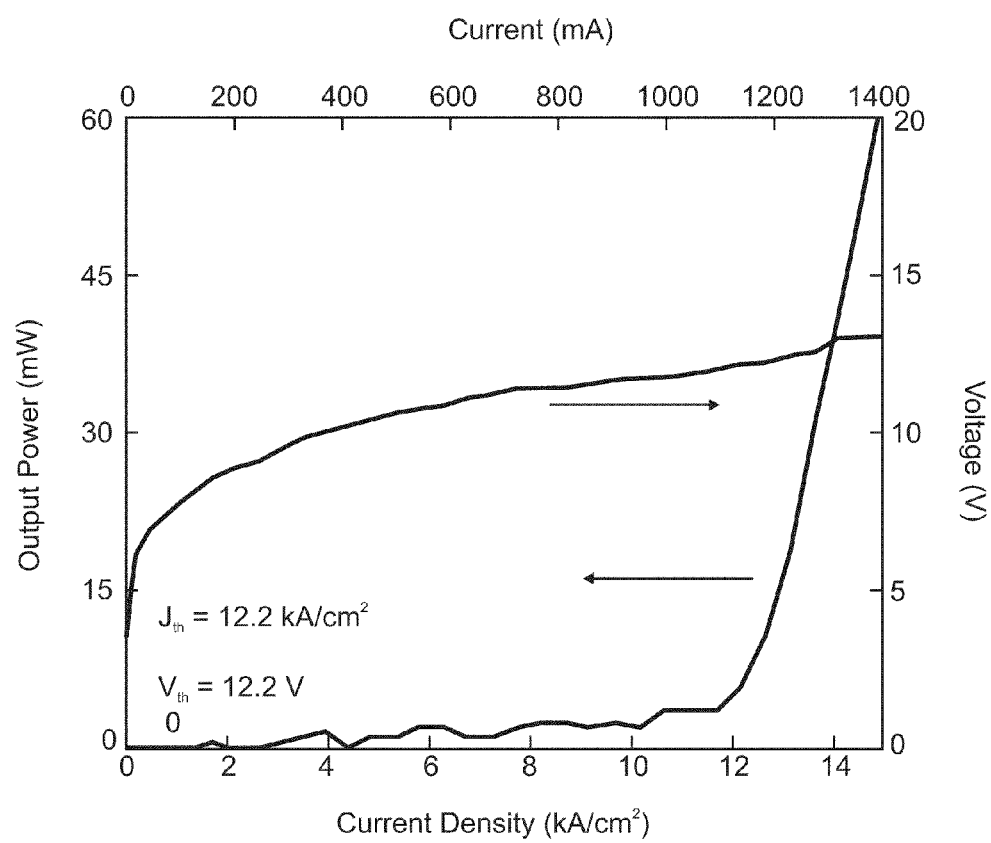
FIG. 6(a) shows Light-Current-Voltage (L-I-V) characteristics and FIG. 6(b) shows the lasing spectrum, of an etched facet laser diode grown on a {30-3-1} GaN substrate.
Figure 6B:
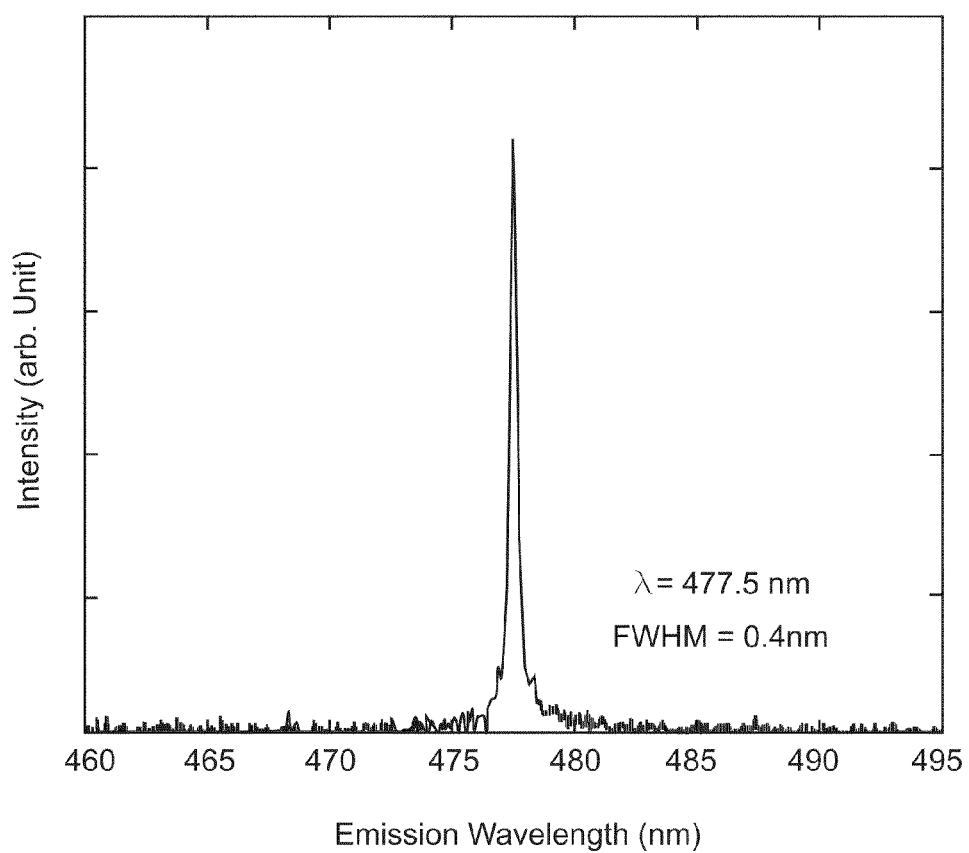

FIG. 6(a) shows L-I-V characteristics, and FIG. 6(b) shows a lasing spectrum, of an etched facet LD having the structure of FIG. 3(a) grown on a {30-3-1} GaN substrate (and processed according to FIG. 2), showing an FWHM of 0.4 nm and a lasing peak at 477.5 nm.

FIGS. 7(a)-7(e) are measurements of the etched facet AlGaN cladding-free InGaN/GaN LD of FIG. 3(a) grown on a semipolar (30-31) GaN substrate and processed according to the steps of FIG. 2.

Figure 7A:
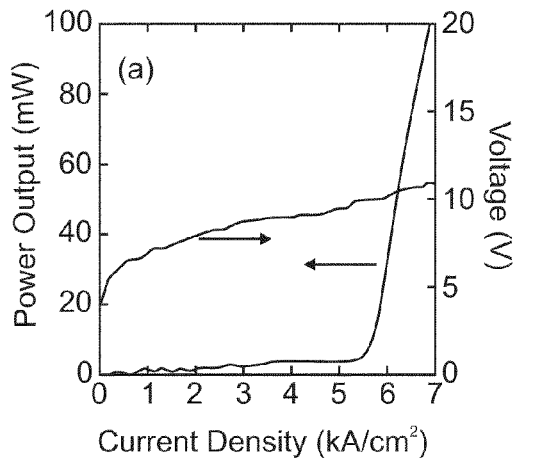
FIG. 7(a) shows L-I-V characteristics.
Figure 7B:
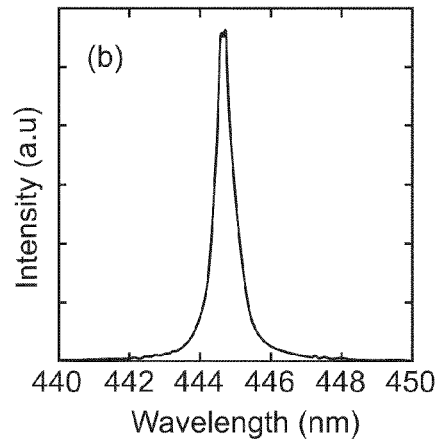
FIG. 7(b) shows a lasing spectrum, of an etched facet 10 μm×1800 μm LD grown on a {30-31} GaN substrate, wherein the measurements were taken at 20° C. using 1 μs pulses and a duty cycle of 0.1% to ensure minimal device self-heating effects.

FIG. 7(a) shows L-I-V characteristics, and FIG. 7(b) shows the lasing spectrum of the etched facet AlGaN cladding-free InGaN/GaN LD. All measurements were taken at 20° C. using 1 μs pulses and a duty cycle of 0.1% to ensure minimal device self-heating effects. The lasing spectrum in FIG. 7(b) shows a clear lasing peak at 444.7 nm. The estimated threshold current ($I_{th}$) was 1022 mA, which corresponds to a $J_{th}$ of 5.6 kA/cm². The present invention attributes the relatively high threshold voltage of 9.9 V to unoptimized p-contacts and doping profiles.

Figure 7C:
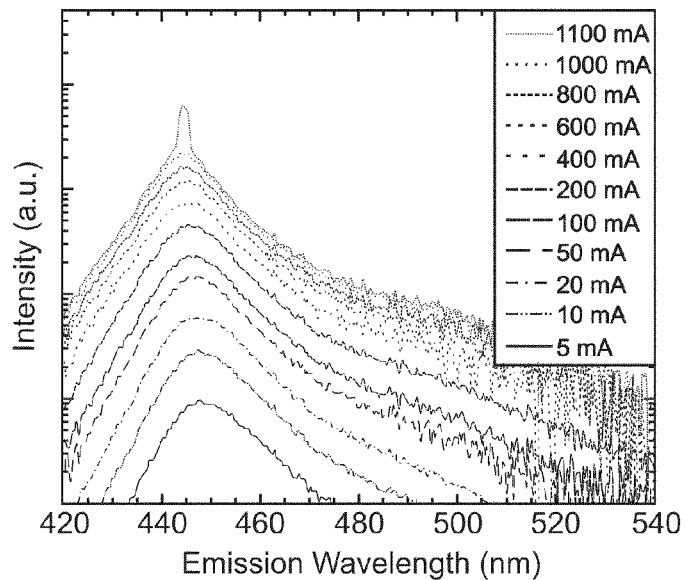
FIG. 7(c) shows electroluminescence (EL) spectra for low current injections up to threshold, for the device of FIG. 7(a), wherein EL intensity (arbitrary units, a.u.) increases with increasing current injection (milliamps, mA).

FIG. 7(c) shows a series of EL spectra measured as a function of current.

Figure 7D:
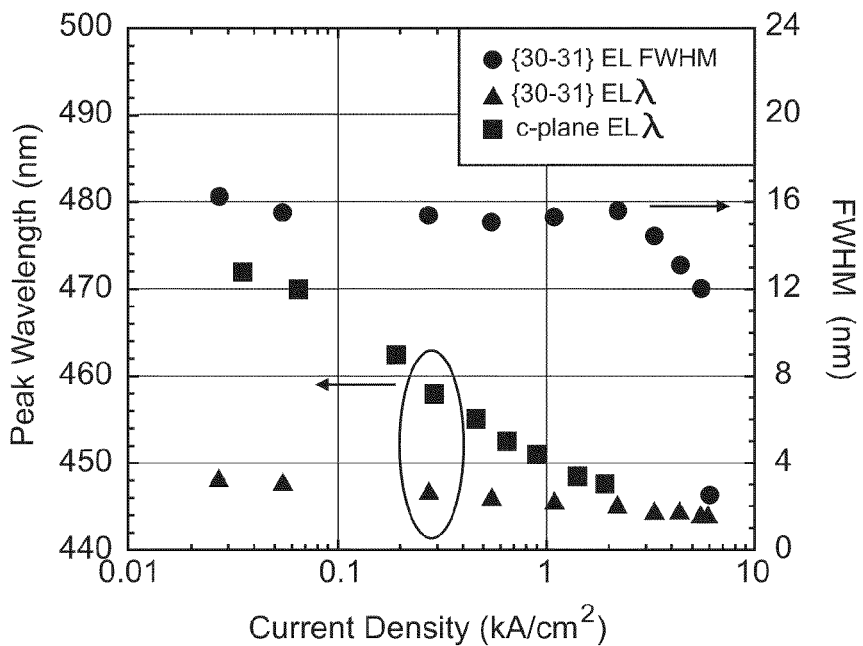
FIG. 7(d) shows peak wavelength and full width at half maximum (FHWM) dependence on current density, wherein peak wavelength data for a 450 nm c-plane LD is included for comparison [22], for the device of FIG. 7(a).

FIG. 7(d) shows the peak EL wavelength shifted from approximately 448 nm at 0.03 kA/cm² to 444 nm just above threshold at 6.0 kA/cm². This value of the EL blue-shift is comparable to m-plane LDs and considerably lower than c-plane LDs emitting at a similar wavelength (c-plane data is shown for comparison) [22, 8]. FIG. 7(d) also shows the dependence of spectral width, or laser peak FWHM, on current density, which narrowed from 16.3 nm at 0.03 kA/cm² to 2.5 nm just above threshold.

Figure 7E:
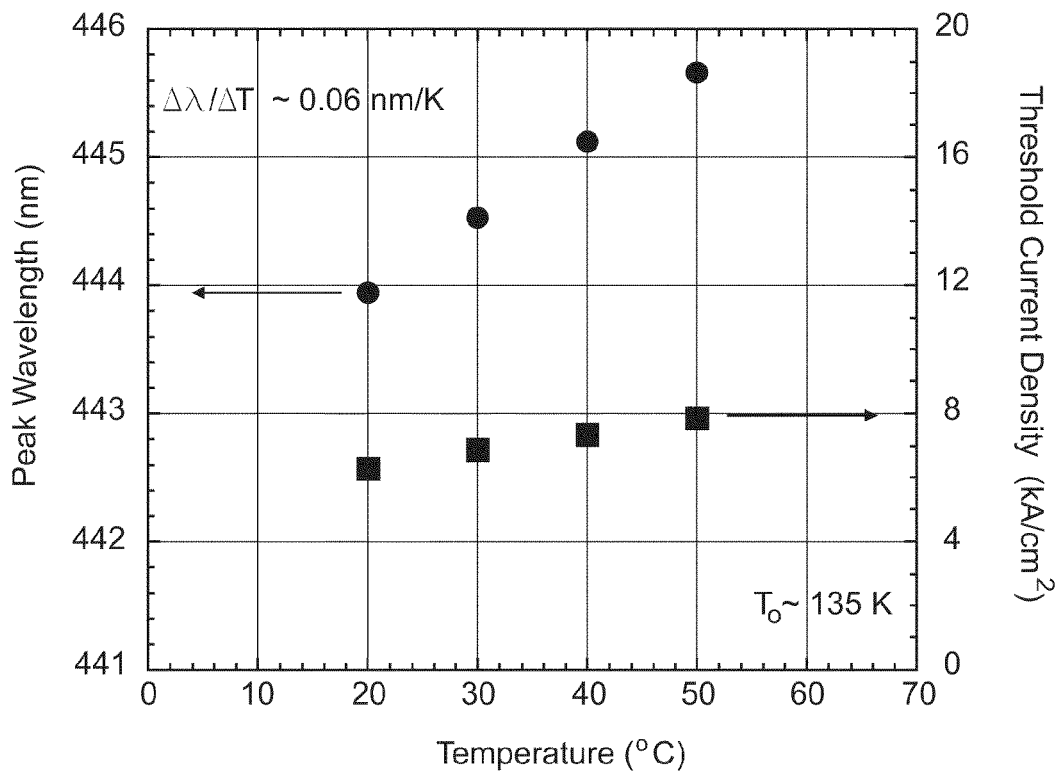
FIG. 7(e) shows dependence of threshold current density and lasing wavelength on stage temperature, for the device of FIG. 7(a).

FIG. 7(e) shows $J_{th}$ and peak wavelength (at an output power of ~35 mW) as a function of stage temperature. A characteristic temperature ($T_o$) value of ~135 K was estimated by plotting the natural log of threshold current with respect to temperature and calculating the inverse of the slope. This value compares well to those reported for c-plane devices emitting at the same wavelength range [23-24]. The dependence of the peak wavelength on temperature was calculated to be ~0.06 nm/K, which also corresponds well to values reported for LDs grown on m-plane, c-plane, and the (20-21) plane [9, 2, 25, 15].

The present invention estimates a confinement factor of ~4.9% for the LD structure of FIG. 3(a). However, a lasing with a lower confinement factor may be possible, and the LD structure of FIG. 3(a) may also have a higher confinement factor.

The present invention enables improved laser performance. This initial LD performance coupled with high theoretical critical thickness, and low quantum confined stark effect (QCSE), suggests that semipolar (30-31) plane has great potential for long wavelength LD applications. Higher critical thickness of strained (Al, Ga, In)N alloy layers epitaxially grown on semi-polar GaN substrates enable the present invention to improve modal confinement for coherent laser diode waveguide layers. Thicker quantum-wells help reduce effective carrier density in quantum-wells (reducing Auger-type losses) and can facilitate low transparency carrier density.

Possible Modifications

Variations include various possible epitaxial growth techniques, laser device structures, different dry-etching techniques, including Inductively Coupled Plasma (ICP), Reactive Ion Etching (RIE), Focused Ion Beam (FIB), CMP, Chemically Assisted Ion Beam Etching (CAIBE), formation of facet mirrors by cleaving, formation of facet mirrors by laser ablation, variations in waveguide structures, facets made by two types of etching techniques or different angles (superluminescent diodes (SLDs)), and facets mirrors coated with the same/two different types of dielectrics, etc.

For example:

Miscuts include, but are not limited to, {30-31}, {30-3-1}, {40-41}, and {40-4-1} planes, etc. Numerous semi-polar planes with other miller indices are possible. (30-31), (30-3-1), (40-41), and (40-4-1) are just listed as examples. Using atomically specific planes, smooth epitaxial growth is possible.

LD devices on such miscuts may have etched facet mirrors, or laser ablated facet mirrors whenever cleaved facet mirrors are not possible.

LD devices on such miscuts may have cleaved facet mirrors with tilted facets (e.g. facets tilted with respect to a growth plane 304 of the LD), or facets perpendicular to the growth plane 304. For example, the above described {30-31} laser may have cleaved facets.

LD devices on such miscuts may have waveguides oriented in the c-projection direction for higher gain.

LD devices on such miscuts may employ optical feedback from cavity mirrors and/or facets and/or a Distributed Bragg Reflector (DBR) and/or gratings, etc.

LD devices on such miscuts may employ optical gain (e.g., SLD or semiconductor optical amplifiers).

LD devices on such miscuts may employ different waveguide structures.

LD devices on such miscuts may have one or two angled facets or rough facets (formed by wet chemical etching) to suppress feedback (SLD).

LD devices on such miscuts may have passive cavities or saturable absorbers.

Devices may include Continuous Wave operated lasers, and devices with increased lasing and spontaneous wavelength.

Devices may be grown on other III-nitride substrates other than GaN. The semi-polar crystal plane 304 may be a semi-polar GaN crystal plane or a semi-polar III-Nitride crystal plane. Alternatively, the semi-polar crystal plane may be a semi-polar plane 304 of GaN (e.g., GaN substrate) or of a III-Nitride (e.g., III-Nitride substrate). The semi-polar plane 304 may then be oriented or miscut x degrees from an m-plane of the III-Nitride and in a c-direction of the III-Nitride, where −15<x<−1 and 1<x<15 degrees. The semi-polar plane 304 may be planar. One or more of the III-Nitride layers 308-322 may be planar layers. For example, one or more of the III-Nitride layers 308-322, 326, 328, 330 may have a top surface (e.g. 340, 342) that is planar. One or more of the III-Nitride layers 308-322, 326, 328, 330 may have interfaces (with other III-Nitride layers) that are planar.

Devices may be grown using growth methods other than MOCVD, including, but not limited to, molecular beam epitaxy (MBE) and hydride vapor phase epitaxy (HYPE), for example.

Variations also include other optoelectronic devices (LEDs, photonic crystal lasers, solar cells, photodetectors, etc.) grown on m-plane substrates miscut x degrees in the c-direction (where −15<x<−1 and 1<x<15 degrees). For example, devices on such miscuts may include laser diodes, SLDs, semiconductor amplifiers, and VCSEL lasers.

Advantages and Improvements

Existing (Al,Ga,In)N lasers are typically grown on polar {0001}, non-polar {10-10} and {11-20}, or semi-polar {11-22} and {20-21} planes. Lasers grown on polar and semi-polar planes suffer from polarization related electric fields in the quantum-wells that degrade device performance. While non-polar {10-10} and {11-20} devices are free from polarization related effects, incorporation of high indium concentrations in {10-10}, and high quality crystal growth of {11-20} devices have been shown to be difficult.

Devices grown on semi-polar planes, with miscuts x degrees from the m-plane in the c-direction (where −15<x<−1 and 1<x<15 degrees), have minimal polarization related electric fields in the quantum-wells as compared to conventional semi-polar planes (i.e., {11-22}, {20-21}, etc.). The critical thickness of strained epitaxial (Al, Ga, In)N alloy layers on such GaN miscut m-plane substrates may also be larger than other semi-polar (i.e., {11-22}, {10-1-1}, and {20-21}) crystal planes with miscuts larger than +/−15 degrees from the m-plane in the c-direction. This enables higher thickness and composition for waveguide layers—thus improving modal gain. The present invention's working prototype laser devices on the {30-31} and {30-3-1} plane demonstrates the potential of devices on such m-plane miscut substrates.

Applications for the devices of the present invention include, but are not limited to, optoelectronic devices (lasers, LEDs, etc) for display, lighting, biomedical imaging, illumination applications, etc.

REFERENCES

The following references are incorporated by reference herein.

[1] U. Steegmueller et al.: Proc. of SPIE 7198, 719807 (2009)
[2] D. Queren et al.: Appl. Phys. Lett. 94 (2009) 081119.
[3] A. Avramescu et al.: Appl. Phys. Lett. 95 (2009) 071103.
[4] T. Miyoshi et al.: Appl. Phys. Express 2 (2009) 062201.
[5] J. S. Speck and S. F. Chichibu: MRS Bull. 34 (2009) No. 5, 304.
[6] M. Schmidt et al.: Jpn. J. Appl. Phys. 46 (2007) L190.
[7] K. Kelchner et al.: Appl. Phys. Express 2 (2009) 071003.
[8] M. Kubota et al.: Appl. Phys. Express 1 (2008) 011102.
[9] K. Okamoto et al.: Appl. Phys. Lett. 94 (2009) 071105.
[10] Y. Lin et al.: appl. Phys. Express 2 (2009) 082102.
[11] A. M. Fischer et al.: Appl. Phys. Express 2 (2009) 041002.
[12] A. Tyagi et al.: Jpn. J. Appl. Phys. 46 (2007) L444.
[13] H. Asamizu et al.: Appl. Phys. Express 1 (2008) 091102.
[14] Y. Enya et al.: Appl. Phys. Express 2 (2009) 082101.
[15] A. Tygai et al.: Appl. Phys. Express 3 (2010) 011002.
[16] M. Funato et al.: Appl. Phys. Express. 3 (2010) 021002.
[17] Y. Yoshizumi et al.: Appl. Phys. Express 2 (2009) 092101.
[18] D. Feezell et al.: Jpn. J. Appl. Phys. 46 (2007) L284.
[19] A. Tyagi et al.: Appl. Phys. Lett. 97 (2009) 251905.
[20] E. Young et al.: Appl. Phys. Express 3 (2010) 011004.
[21] J. W. Matthews and A. E. Blakeslee: J. Cryst. Growth 27 (1974) 118.
[22] J. Muller et al.: Appl. Phys. Lett. 95 (2009) 051104.
[23] H. Y. Ryu et al.: Photonics Tech. Lett. 19 (2007) 1717.
[24] T. Kozaki et al.: Proc. of SPIE, 6133 (2006) 613306-1.
[25] S. Bruninghoff et al.: Proc. SPIE 7216 (2009) 72161C.
[26] Anurag Tyagi et al., Applied Physics Letters, 95, 251905 (2009).
[27] Po Shan Hsu, Kathryn M. Kelchner, Anurag Tyagi, Robert M. Farrell, Daniel A. Haeger, Kenji Fujito, Hiroaki Ohta, Steven P. DenBaars, James S. Speck, and Shuji Nakamura, entitled "InGaN/GaN Blue Laser Diode Grown on Semipolar (30-31) Free-Standing GaN Substrates," Applied Physics Express 3 (2010) 052702.
[28] Powerpoint slides by Po Shan Hsu, entitled "InGaN/GaN Laser Diodes Grown on (30-31) and (30-3-1) Free Standing GaN substrates" Solid State Lighting and Energy Center Annual Review, University of California, Santa Barbara, Nov. 5, 2010.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An optoelectronic device, comprising:
one or more semi-polar III-Nitride layers epitaxially grown on a semi-polar crystal plane of GaN, the semi-polar crystal plane having a smoothness and oriented x degrees from an m-plane of the GaN and in a c-direction of the GaN, where $-15 \leq x \leq -1$ and $1 \leq x \leq 15$ degrees; and
one or more of the semi-polar III-Nitride layers having one or more critical thicknesses, one or more compositions, and indium incorporation;
wherein:
the optoelectronic device emits light having a peak intensity at wavelength of at least 444.7 nanometers, and
the one or more critical thicknesses are larger as compared to one or more critical thicknesses of one or more semi-polar III-Nitride layers, having the one or more compositions, deposited on a {11-22} semi-polar crystal plane of GaN.

2. The device of claim 1, wherein the semi-polar crystal plane is a {30-31}, {30-3-1}, {40-41}, or {40-4-1} plane.

3. The device of claim 1, wherein the semi-polar crystal plane is a top surface of a vicinal, miscut, or off-axis free standing GaN substrate.

4. The device of claim 1, wherein the semi-polar III-Nitride layers comprise one or more InGaN layers having a thickness greater than, or equal to, a Mathews-Blakeslee's critical thickness, wherein the critical thickness is for an InGaN layer deposited on a semi-polar crystal plane of GaN oriented 15 degrees or more from an m-plane of the GaN and in a c-direction of the GaN.

5. The device of claim 4, wherein the optoelectronic device is a laser diode and the one or more InGaN layers comprise an InGaN waveguide that provides a modal confinement for the laser diode of at least 4.9%.

6. The device of claim 5, wherein the semi-polar III-Nitride layers further include a light emitting InGaN active layer including one or more InGaN quantum wells, one or more of the quantum wells having an Indium composition of at least 16% and a thickness greater than 4 nanometers.

7. The device of claim 4, wherein the InGaN layers have an Indium composition of at least 7%.

8. The device of claim 1, wherein the optoelectronic device is grown on a miscut or vicinal surface of a GaN substrate, the miscut or vicinal surface including the semi-polar crystal plane, and the semi-polar III-Nitride layers further comprising:
one or more n-type (Al,In,Ga)N layers;
one or more p-type (Al,In,Ga)N layers; and
an InGaN active layer comprising one or more InGaN quantum well layers between the n-type (Al,In,Ga)N layers and the one or more p-type (Al,In,Ga)N layers, wherein the n-type (Al,In,Ga)N layers, the p-type (Al,In,Ga)N layers, and the InGaN quantum well layers have a semi-polar orientation of the semi-polar crystal plane and the InGaN quantum well layers have a peak light emission or a peak light absorption at a wavelength of at least 477 nm.

9. The device of claim 1, wherein the optoelectronic device is a laser diode and the semi-polar III-Nitride layers comprise:
an n-type GaN layer on or above the semipolar crystal plane;

an n-type InGaN waveguiding layer on or above the n-type GaN layer, the n-type InGaN waveguiding layer having a thickness of at least 50 nm and an Indium composition of 7% or more;

an InGaN active layer on or above the n-type InGaN waveguiding layer, including one or more InGaN quantum well layers with an Indium composition of at least 7% and a thickness of more than 4 nm;

a p-type InGaN waveguiding layer on or above the InGaN active layer; and a p-type GaN layer on or above the p-type InGaN waveguiding layer, the p-type InGaN waveguiding layer having a thickness of at least 50 nm and an Indium composition of 7% or more, wherein the semi-polar III-Nitride layers have a semipolar orientation of the semipolar crystal plane.

10. The device of claim 1, wherein the semi-polar crystal plane comprises an atomically specific plane, so that a smooth epitaxial growth of the III-Nitride layers is achieved.

11. The device of claim 1, wherein the device grown on the semi-polar crystal plane includes a laser diode, light emitting diode, superluminescent diode, semiconductor amplifier, photonic crystal laser, VCSEL laser, solar cell, or photodetector.

12. The device of claim 1, wherein the device is a laser diode grown on the semi-polar crystal plane, the laser diode comprising a waveguide oriented in a c-projection direction of the laser diode, for higher gain.

13. The device of claim 1, wherein one or more of the semi-polar III-Nitride layers have a surface roughness of 0.75 nm or less.

14. The device of claim 1, wherein the optoelectronic device is a laser diode having a threshold current density of no more than 12.2 kiloamps per centimeter square and comprises a coherently strained structure as measured by Bragg peaks for each of the III-nitride layers lining up vertically on a $Q_x$ axis of an X-ray Reciprocal Space Map.

15. A method of fabricating an optoelectronic device, comprising:

depositing one or more semi-polar III-Nitride layers epitaxially on a semi-polar crystal plane, the semi-polar crystal plane having a smoothness and oriented x degrees from an m-plane of the GaN and in a c-direction of the GaN, where $-15 \leq x \leq -1$ and $1 \leq x \leq 15$ degrees, and one or more of the semi-polar III-Nitride layers having one or more critical thicknesses, one or more compositions, and indium incorporation;

wherein:

the optoelectronic device emits light having a peak intensity at wavelength of at least 444.7 nanometers, and the one or more critical thicknesses are larger as compared to one or more critical thicknesses of one or more semi-polar III-Nitride layers, having the one or more compositions, deposited on a {11-22} semipolar crystal plane of GaN.

16. The method of claim 15, wherein the semi-polar crystal plane is a {30-31}, {30-3-1}, {40-41}, or {40-4-1} plane.

17. The method of claim 15, wherein the semi-polar crystal plane is a top surface of a vicinal, miscut, or off-axis free standing GaN substrate.

18. The method of claim 15, wherein the depositing of the semi-polar III-Nitride layers comprises depositing one or more InGaN layers having a thickness greater than, or equal to, a Mathews-Blakeslee's critical thickness, wherein the critical thickness is for an InGaN layer deposited on a semipolar crystal plane of GaN oriented 15 degrees or more from an m-plane of the GaN and in a c-direction of the GaN.

19. The method of claim 18, wherein the optoelectronic device is a laser diode and the one or more InGaN layers comprise an InGaN waveguide that provides a modal confinement for the laser diode, the laser diode having a lasing peak at a wavelength of at least 460 nm.

20. The device of claim 19, wherein the depositing of the semi-polar III-Nitride layers further includes depositing a light emitting InGaN active layer including one or more InGaN quantum wells, one or more of the quantum wells having an Indium composition of at least 16% and a thickness greater than 4 nanometers.

21. The device of claim 19, wherein the InGaN layers have an Indium composition of at least 7%.

22. The method of claim 15, wherein:

the optoelectronic device is deposited on a miscut or vicinal surface of a GaN substrate, the miscut or vicinal surface including the semi-polar GaN crystal plane, and the depositing of the semi-polar III-Nitride layers further comprises:

depositing one or more n-type (Al,In,Ga)N layers on the semi-polar crystal plane, depositing an InGaN active layer comprising one or more InGaN quantum well layers on or above the one or more n-type (Al,In,Ga)N layers, and depositing one or more p-type (Al,In,Ga)N layers on the InGaN quantum well layers, wherein the n-type (Al,In,Ga)N layers, the p-type (Al,In,Ga)N layers, and the InGaN quantum well layers have a semi-polar orientation of the semi-polar crystal plane, and the InGaN quantum well layers have a peak light emission or a peak light absorption at a wavelength of at least 477 nm.

23. The method of claim 15, wherein the optoelectronic device is a laser diode, the depositing of the semi-polar III-Nitride layers further comprising:

depositing an n-type GaN layer on or above the semi-polar crystal plane;

depositing an n-type InGaN waveguiding layer on or above the n-type GaN layer, the n-type InGaN waveguiding layer having a thickness of at least 50 nm and an Indium composition of 7% or more;

depositing an InGaN active layer on or above the n-type InGaN waveguiding layer, including one or more InGaN quantum well layers with an Indium composition of at least 7% and a thickness of more than 4 nm;

depositing a p-type InGaN waveguiding layer on or above the InGaN quantum wells; and depositing a p-type GaN layer on or above the p-type InGaN waveguiding layer, the p-type InGaN waveguiding layer having a thickness of at least 50 nm and an Indium composition of 7% or more, wherein the semi-polar III-Nitride layers have a semi-polar orientation of the semi-polar crystal plane.

24. The method of claim 15, wherein the semi-polar crystal plane comprises an atomically specific plane, so that a smooth epitaxial growth of the III-Nitride layers is achieved.

25. The method of claim 15, wherein the optoelectronic device deposited on the semi-polar GaN crystal plane includes a laser diode, light emitting diode, superluminescent diode, semiconductor amplifier, photonic crystal laser, VCSEL laser, solar cell, or photodetector.

26. The method of claim 15, wherein the optoelectronic device is a laser diode grown on the semi-polar crystal plane, and the laser diode comprises a waveguide oriented in a c-projection direction of the laser diode, for higher gain.

27. The method of claim 15, further comprising:
    selecting the semi-polar crystal plane in order to increase the critical thicknesses of one or more of the semi-polar III-Nitride layers grown on the semi-polar crystal plane.

28. The method of claim 15, wherein the semi-polar crystal plane and the depositing conditions are such that one or more of the semi-polar III-Nitride layers have a surface roughness of 0.75 nm or less.

* * * * *

UNITED STATES PATENT AND TRADEMARK OFFICE
CERTIFICATE OF CORRECTION

| | | |
|---|---|---|
| PATENT NO. | : 9,077,151 B2 | Page 1 of 1 |
| APPLICATION NO. | : 13/041120 | |
| DATED | : July 7, 2015 | |
| INVENTOR(S) | : Po Shan Hsu et al. | |

It is certified that error appears in the above-identified patent and that said Letters Patent is hereby corrected as shown below:

On the title page

Item (75) Inventors:

Please change the name "S. James Speck, Goleta, CA (US)" to read --James S. Speck, Goleta, CA (US)--.

In the claims

Column 14:

Claim 1, line 11, please delete "$-15 \leq x \leq -1$ and $1 \leq x \leq 15$" and insert -- $-15 < x < -1$ and $1 < x < 15$--.

Column 15:

Claim 15, line 45, please delete "$-15 \leq x \leq -1$ and $1 \leq x \leq 15$" and insert -- $-15 < x < -1$ and $1 < x < 15$--.

Signed and Sealed this
Twenty-fourth Day of May, 2016

Michelle K. Lee
*Director of the United States Patent and Trademark Office*